United States Patent
Coyne

(10) Patent No.: US 10,862,471 B2
(45) Date of Patent: Dec. 8, 2020

(54) SIGNAL MODULATOR

(71) Applicant: Dialog Semiconductor (UK) Limited, London (GB)

(72) Inventor: David Coyne, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/288,384

(22) Filed: Feb. 28, 2019

(65) Prior Publication Data
US 2020/0280306 A1    Sep. 3, 2020

(51) Int. Cl.
*H03K 7/08* (2006.01)
*H03F 3/217* (2006.01)
*H03K 7/10* (2006.01)

(52) U.S. Cl.
CPC .............. *H03K 7/08* (2013.01); *H03F 3/217* (2013.01); *H03K 7/10* (2013.01); *H03F 2200/351* (2013.01)

(58) Field of Classification Search
CPC .. H03K 7/08; H03K 7/10; H03F 3/217; H03F 2200/351
See application file for complete search history.

(56) References Cited

U.S. PATENT DOCUMENTS

| | | | |
|---|---|---|---|
| 9,048,791 B2 * | 6/2015 | Kinyua | H03F 3/217 |
| 9,559,648 B2 | 1/2017 | Cotton | |
| 2012/0045076 A1* | 2/2012 | Gonano | H03F 3/217 |
| | | | 381/120 |
| 2013/0003994 A1* | 1/2013 | Watanabe | H03F 1/32 |
| | | | 381/120 |
| 2013/0127531 A1* | 5/2013 | Lesso | H03F 3/217 |
| | | | 330/251 |
| 2017/0373595 A1 | 12/2017 | Huang et al. | |
| 2017/0373596 A1 | 12/2017 | Huang et al. | |
| 2018/0331660 A1* | 11/2018 | Hoyerby | H03F 3/2173 |

OTHER PUBLICATIONS

Application Note 3977, Technical Paper, "Class D Amplifiers: Fundamentals of Operation and Recent Developments," Maxim Integrated, Jan. 31, 2007, pp. 1-12, found: http://www.maximintegrated.com/an3977.

(Continued)

*Primary Examiner* — Jeffrey M Shin
(74) *Attorney, Agent, or Firm* — Saile Ackerman LLC; Stephen B. Ackerman

(57) ABSTRACT

A signal modulator for modulating at least one input signal is disclosed. The modulator includes an adaptive ramp generator receiving a clock signal having a clock cycle. The adaptive ramp generator provides a ramp signal having a profile starting from a minimum level adjusted in each clock cycle. The signal modulator may receive a first, second, and third input signal, and a clock signal. The first and second input signals may derive from a single signal where the second signal is equal to the first signal shifted by 180 degrees. The third signal may be a fixed level that sets the nominal duty cycle of the modulator. The input signal having the highest amplitude among the first, second, and third input signals is identified. The minimum level of the ramp signal is adjusted, and the peak value of the ramp maintained substantially equal to the signal having the highest amplitude.

19 Claims, 19 Drawing Sheets

(56) References Cited

OTHER PUBLICATIONS

Texas Instruments, DRV595, "15V/±4A High-Efficiency PWM Power Driver," SLOS808A—Dec. 2012, www.ti.com/product/DRV595, 24 pgs.

Texas Instruments, "TPA3116D2 15-W, 30-W, 50-W Filter-Free Class-D Stereo Amplifier Family With AM Avoidance," SLOS708G—Apr. 2012, 44 pgs.

Texas Instruments, "PA3128D2, TPA3129D2 2×30-W, 2×15-W Class-D Amplifier With Low Idle Power Dissipation," SLOS941C—May 2016, 37 pgs.

Texas Instruments, "TPA3255 315-W Stereo,600-W Mono PurePath TM Ultra-HD Analog-Input," SLASEA8A—Feb. 2016, 46 pgs.

German Office Action, File No. 10 2019 209 089.3, Applicant: Dialog Semiconductor (UK) Limited, dated Feb. 3, 2020, 6 pages, and English language translation, 6 pages.

* cited by examiner

SIGNAL MODULATOR

TECHNICAL FIELD

The present disclosure relates to a signal modulator. In particular, the present disclosure relates to a pulse-width modulator.

BACKGROUND

Pulse-width modulators are used in many applications. In particular they may be used to drive a power stage in audio amplifier systems such as class D amplifiers. Various signal modulations techniques have been proposed including AD modulation, BD modulation and 1SPW modulation.

These modulation techniques have limited applications. For instance, when using an AD modulator to drive a power stage, only minimum and maximum duty cycles values should be used to ensure a reliable operation of the power stage. Limiting the duty-cycle to minimum and maximum values causes the power stage transfer function to exhibit nonlinear regions that result in distortions. Existing low duty-cycle modulation schemes such as 1SPW have a highly non-linear transfer function leading to significant distortion and reduced stability.

SUMMARY

It is an object of the disclosure to address one or more of the above-mentioned limitations.

According to a first aspect of the disclosure, there is provided a signal modulator for modulating at least one input signal; the modulator comprising an adaptive ramp generator adapted to receive a clock signal having a clock cycle, to provide a ramp signal having a profile starting from a minimum level in each clock cycle and to adjust the minimum level in each clock cycle.

Optionally, the at least one input signal varies within an amplitude range, and the adaptive ramp generator is adapted to adjust the minimum level such that a peak value of the ramp signal is maintained substantially equal to the input signal in more than one region within the input signal amplitude range.

Optionally, the signal modulator comprises an input stage adapted to receive the at least one input signal and a reference signal; wherein the said at least one input signal comprises a first input signal and a second input signal; wherein the adaptive ramp generator is adapted to identify the signal having the highest amplitude among the first input signal, the second input signal and the reference signal; and to adjust the minimum level such that a peak value of the ramp signal is maintained substantially equal to the signal having the highest amplitude.

Optionally, the reference signal has a reference level defining a minimum duty cycle.

Optionally, the ramp signal profile is a periodic profile that varies linearly between the minimum level and a maximum level in each clock cycle; the ramp profile being characterised by a maximum absolute amplitude.

Optionally, wherein upon identifying that one of the first and second input signals is greater than the reference level the minimum level is set equal to the amplitude of the input signal having the highest amplitude minus the maximum absolute amplitude of the ramp profile, and upon identifying that the first and second input signals are both lower than the reference level, the minimum level is set to the reference level.

Optionally, the adaptive ramp generator comprises a ramp generation circuit coupled to a ramp shift generator, the ramp shift generator being adapted to calculate an offset value to adjust the minimum level.

Optionally, the adaptive ramp generator comprises a duty-cycle distortion sensor coupled to the ramp shift generator; the duty-cycle distortion sensor being adapted to sense a power stage duty-cycle distortion and to provide a duty-cycle distortion correction coefficient; wherein the ramp shift generator generates the offset value based on the duty-cycle distortion correction coefficient.

Optionally, the signal modulator comprises a region identifier coupled to the adaptive ramp generator; the region identifier being adapted to identify a region of operation of the modulator; wherein the duty-cycle distortion sensor is adapted to provide the duty-cycle distortion correction coefficient based on the region of operation.

For example, different regions may be identified by comparing the input signal with respect to a first reference signal and a second reference signal.

Optionally, the power stage duty-cycle distortion is sensed at a transition point between different regions of operation.

Optionally, the input stage is adapted to generate a first mask signal when a magnitude of the first input signal is above a threshold value, and a second mask signal when a magnitude of the second input signal is above the threshold value.

Optionally, the signal modulator comprises a comparator stage adapted to compare the first input signal with the ramp signal to provide a first modulated output and to compare the second input signal with the ramp signal to provide a second modulated output; the comparator stage being adapted to receive the first and second mask signals and to block the first modulated output when the first mask signal is asserted; and to block the second modulated output when the second mask signal is asserted.

Optionally, each one of the first and second modulated output signals comprises a pulse and wherein the adaptive ramp generator is adapted to block the first modulated output or the second modulated output when its pulse has a pulse-width that falls below a minimum threshold.

For instance, the minimum threshold may be a minimum value necessary to operate a power stage.

According to a second aspect of the disclosure, there is provided a signal amplifier comprising a power stage comprising a first half-bridge and a second half-bridge; and a modulator adapted to provide a first modulated output for driving the first half-bridge; and a second modulated output for driving the second half-bridge, wherein the modulator comprises an adaptive ramp generator adapted to receive a clock signal having a clock cycle, to provide a ramp signal having a profile starting from a minimum level in each clock cycle and to adjust the minimum level in each clock cycle.

The signal amplifier according to the second aspect of the disclosure may comprise any of the features described above in relation to the signal modulator according to the first aspect of the disclosure.

According to a third aspect of the disclosure, there is provided a method of modulating at least one input signal, the method comprising receiving the at least one input signal, receiving a clock signal having a clock cycle, providing a ramp signal having a profile that starts from a minimum level in each clock cycle and adjusting the minimum level in each cycle.

Optionally, the method comprises receiving a reference signal, and identifying the signal having the highest amplitude among the at least one input signal and the reference signal, and adjusting the minimum level such that a peak value of the ramp signal is maintained substantially equal to the signal having the highest amplitude.

Optionally, the reference signal has a reference level defining a minimum duty cycle.

Optionally, the ramp signal profile is a periodic profile that varies linearly between the minimum level and a maximum level in each clock cycle; the ramp profile being characterised by a maximum absolute amplitude.

Optionally, the said at least one input signal comprises a first input signal and a second input signal; wherein upon identifying that one of the first and second input signals is greater than the reference level, the minimum level is set equal to the amplitude of the input signal having the highest amplitude minus the maximum absolute amplitude of the ramp profile; and upon identifying that the first and second input signals are both lower than the reference level, the minimum level is set to the reference level.

Optionally, providing the ramp signal comprises modifying an existing ramp signal.

The third aspect may share features of the first aspect, as noted above and herein.

BRIEF DESCRIPTION OF THE DRAWINGS

The disclosure is described in further detail below by way of example and with reference to the accompanying drawings.

DETAILED DESCRIPTION

Figure 1:
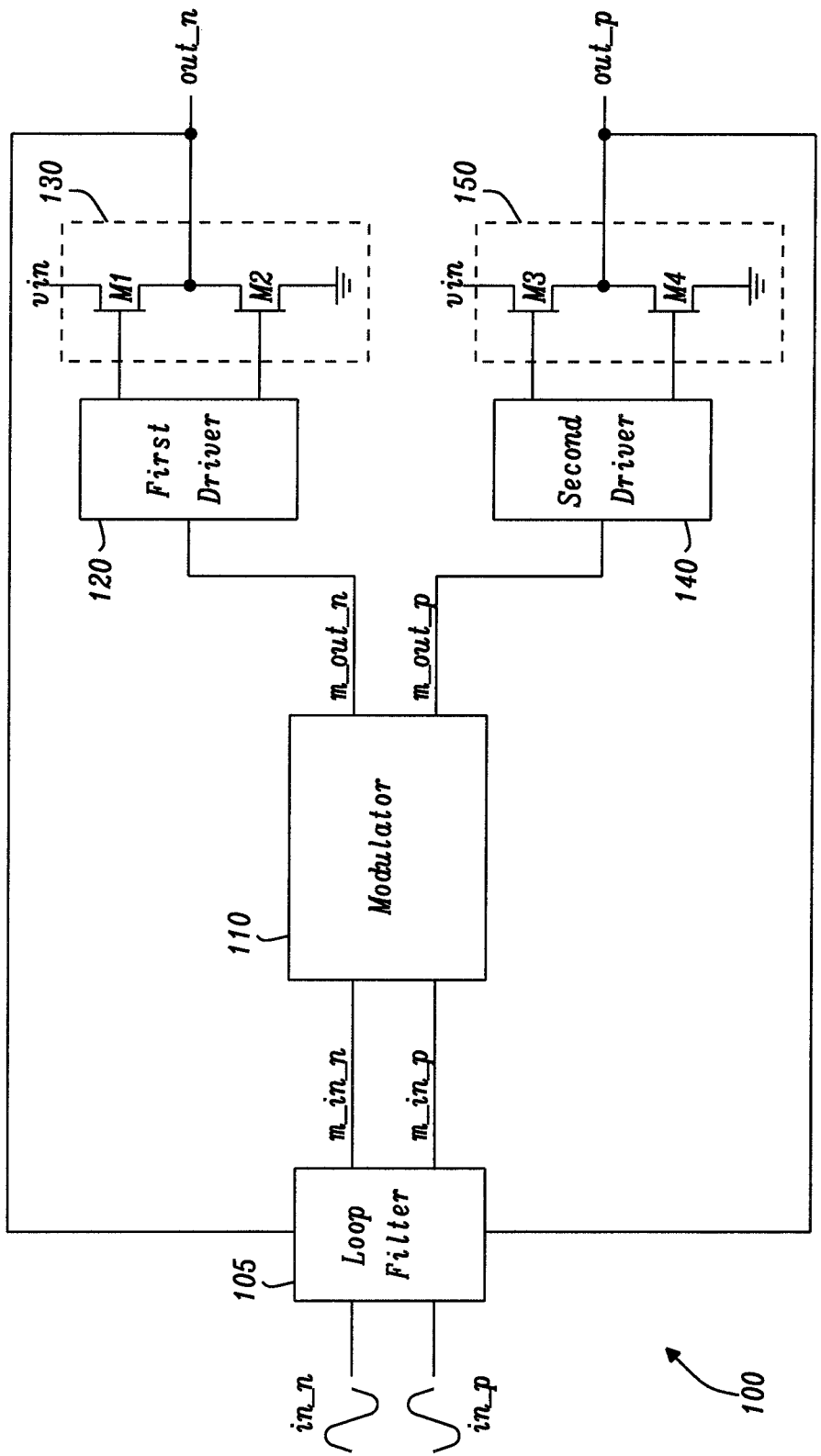
FIG. 1 is a diagram of a class D amplifier.

FIG. 1 illustrates a class D amplifier 100, for amplifying an input signal. The amplifier 100 includes a loop filter 105 and a modulator 110 coupled to a full-bridge power stage. The modulator 110 is coupled to a first driver 120 for driving a first half-bridge 130 formed by power switches M1 and M2; and to a second driver 140 for driving a second half-bridge 150 formed by power switches M3 and M4. The outputs of the first and second half-bridges 130 and 150 are coupled to the loop filter 105 hence forming a feedback loop.

In operation, the loop filter 105 suppresses the noise which may be present in the first and second input signals in_n and in_p and feedback signals out_n and out_p, said loop filter producing loop filter output signals m_in_n and m_in_p respectively. The modulator 110 receives the loop filter output signals m_in_n and m_in_p and generates a pulse-width modulated PWM output signal for each one of the loop filter output signals, referred to as m_out_n and m_out_p respectively. The first PWM modulated signal m_out_n is received by the driver 120, which then generates a high side drive signal for driving M1 and a low side drive signal for driving M2. The first half-bridge 130 hence provides an amplified output signal out_n. Similarly, the second PWM modulated signal m_out_p is received by the driver 140, which then produces a high side drive signal for driving M3 and a low side drive signal for driving M4 in the second half-bridge 150. The second half-bridge 150 hence provides an amplified output signal out_p. The amplified signals out_n and out_p may be fed to a transducer such as a speaker.

Figure 2:
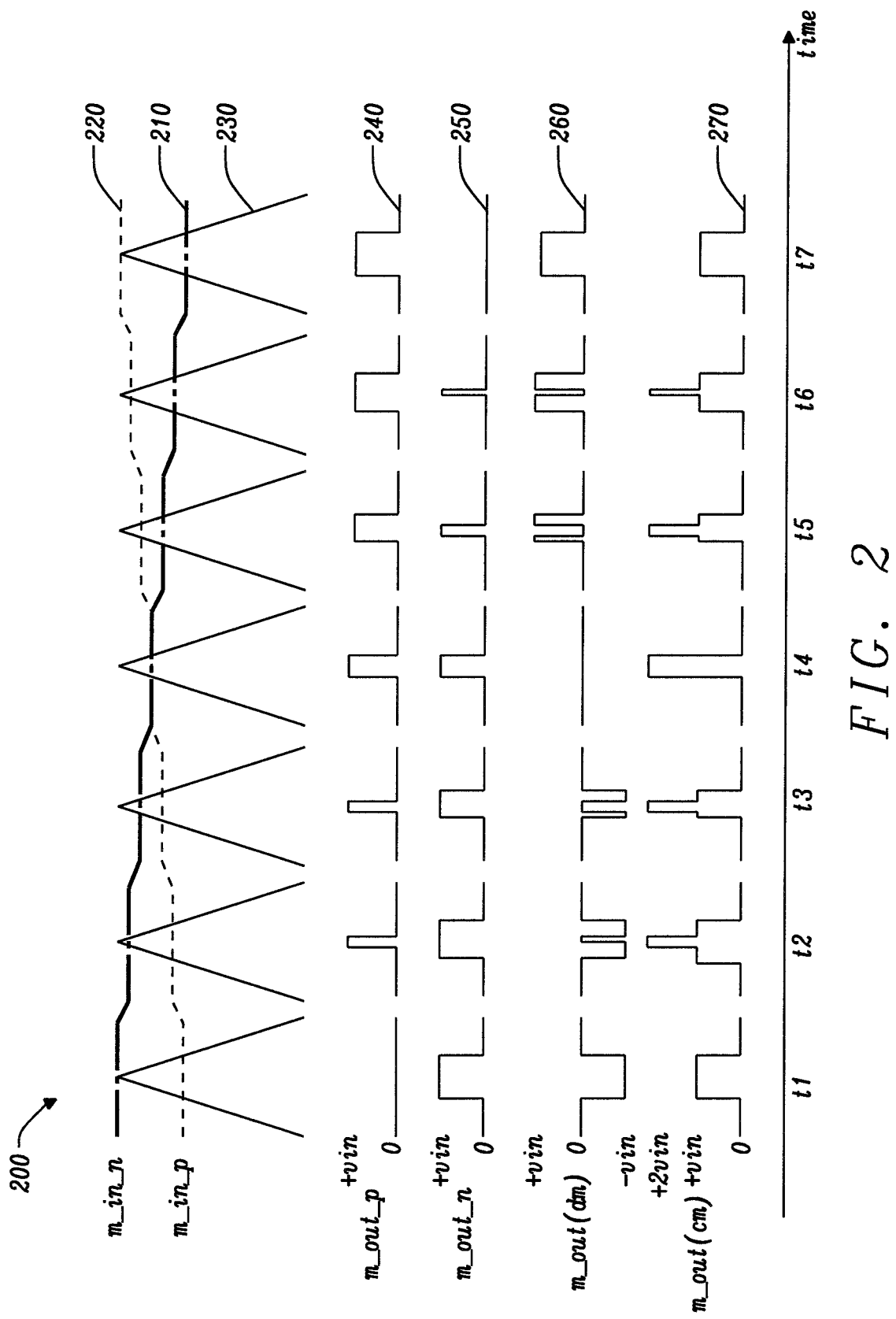
FIG. 2 is a timing diagram illustrating the working of a conventional low duty-cycle modulator.

FIG. 2 is timing diagram 200, illustrating the working of a conventional low duty-cycle modulator with the modulator input m_in_p increasing in time and the modulator input m_in_n decreasing in time. FIG. 2 shows the waveforms of a first input signal m_in_n, 210, a second input signal m_in_p 220 and a triangular ramp signal 230. Also illustrated are the first modulated output m_out_p, 240, the second modulated output signal m_out_n, 250, together with a difference signal 260 of the first modulated signal 240 minus the second modulated signal 250. The modulator is inverting meaning that m_in_n 210 generates m_out_p 240 and m_in_p 220 generates m_out_n 250. Also shown is a sum signal 270, the sum of the first modulator output signal 240 and second modulator output signal 250.

The modulation scheme also referred to as 1SPW, operates as follows. A high-efficiency PWM power driver sets a nominal duty-cycle Dnom to a value lower than 50%, for instance 15%. As the modulator input signal increases the output pulse width of the modulated signal 240 increases while the output pulse width of modulated signal 250 decreases as illustrated at time between times t1-t7 respectively.

At and prior to time t1 output pulse 240 narrows to zero resulting in a so-called output clamping of modulator output m_out_p. Similarly, at and after time t7 a point is reached for which the width of output pulse 250 narrows to zero, resulting in a so-called output-clamping of modulator output m_out_n. Since for time periods at or prior to t1 and at or after t7 one of the two output signals 240 or 250 is clamped and one half bridge 150 or 130 respectively is not switching, hence saving energy. However, the 1SPW modulation scheme is limited by significant signal distortion. An evaluation of a simple 1SPW modulation scheme is now discussed.

Figure 3B:
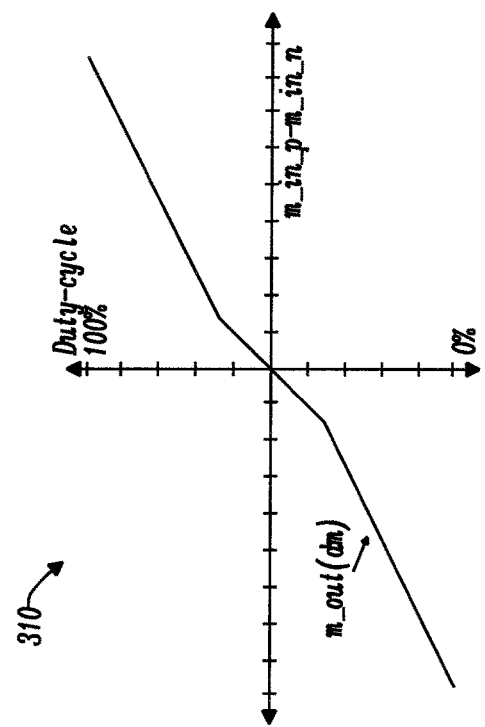
FIG. 3B is the 1SPW modulator transfer function obtained from FIG. 3A.
Figure 3D:
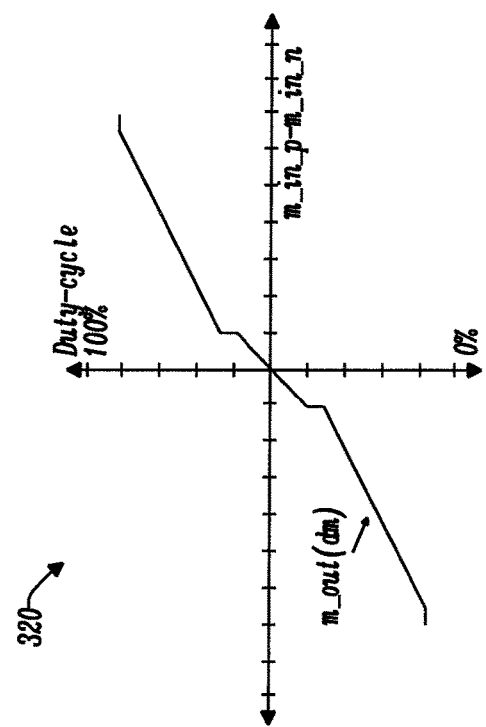
FIG. 3D is the 1SPW modulator transfer function obtained from FIG. 3C.
Figure 3A:
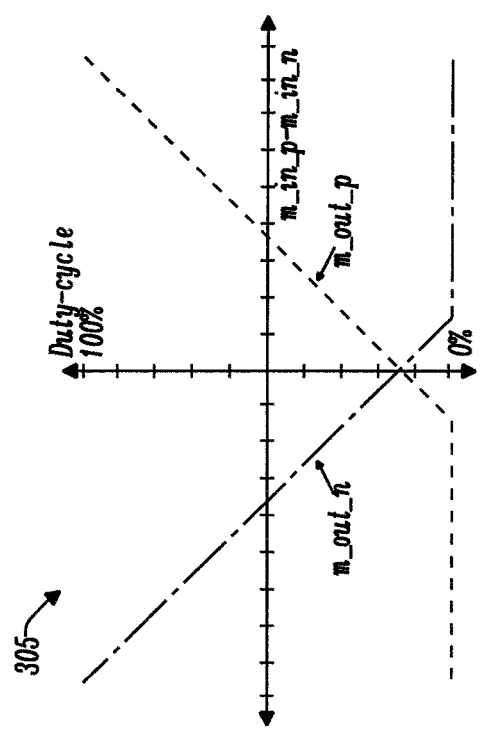
FIG. 3A is a chart illustrating the variations of the PWM output signals generated using the 1SPW modulation scheme.

FIG. 3A is chart 305, illustrating the variations of the PWM output signals m_out_n and m_out_p generated using the 1SPW modulation scheme, as a function of its input signals m_in_p and m_in_n. FIG. 3B shows the 1SPW modulator transfer function 310 obtained from FIG. 3A. The transfer function 310 is nonlinear, hence creating signal distortion. The duty cycle is 30% when the modulator input signals m_in_p and m_in_n create the condition that causes either output 240 or 250 to clamp, hence reducing the incremental gain of the modulator. Such a loop gain change affects stability and requires the loop bandwidth to be set to a low value.

A second-order feedback loop alone may be insufficient to suppress distortion arising from the effect of output clamping. Signal distortion may be reduced by increasing the loop filter bandwidth and gain across the bandwidth of interest with an associated increase in the PWM switching frequency. However, this increases the power consumption of the system. A higher-order loop filter may provide increased gain across the bandwidth of interest and help to suppress distortion. However, higher-order loop filters can prove difficult to stabilize and often require automatic tuning to maintain loop stability over Process Voltage and Temperature (PVT) variations.

Figure 3C:
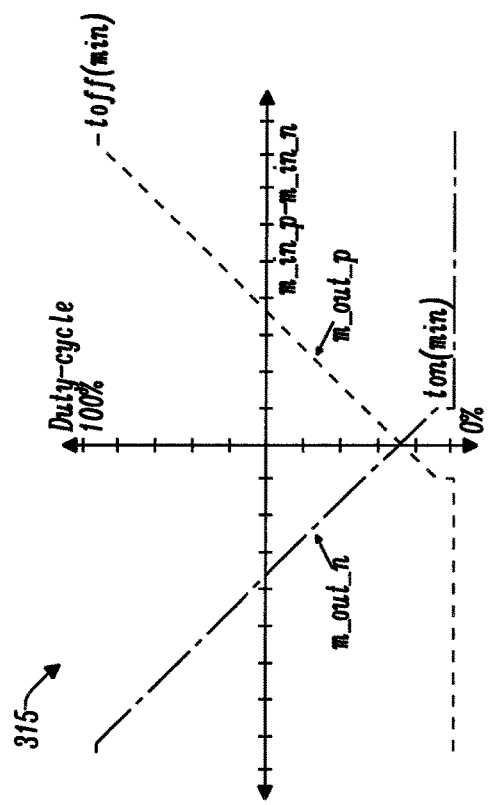
FIG. 3C is a chart illustrating the variations of the PWM output signals generated using the 1SPW modulation scheme when a minimum pulse-width restriction is applied.

FIG. 3C is chart 315, illustrating the variations of the PWM output signals m_out_n and m_out_p generated using the 1SPW modulation scheme when a minimum pulse-width restriction is applied and shown as a function of input signals m_in_p and m_in_n. FIG. 3D shows the 1SPW modulator transfer function 320 obtained from FIG. 3C. An output pulse deemed too narrow is masked by clamping the modulator output. That "lost" pulse creates a vertical step in the transfer function, hence increasing further the non-linearity of the transfer function.

Figure 4:
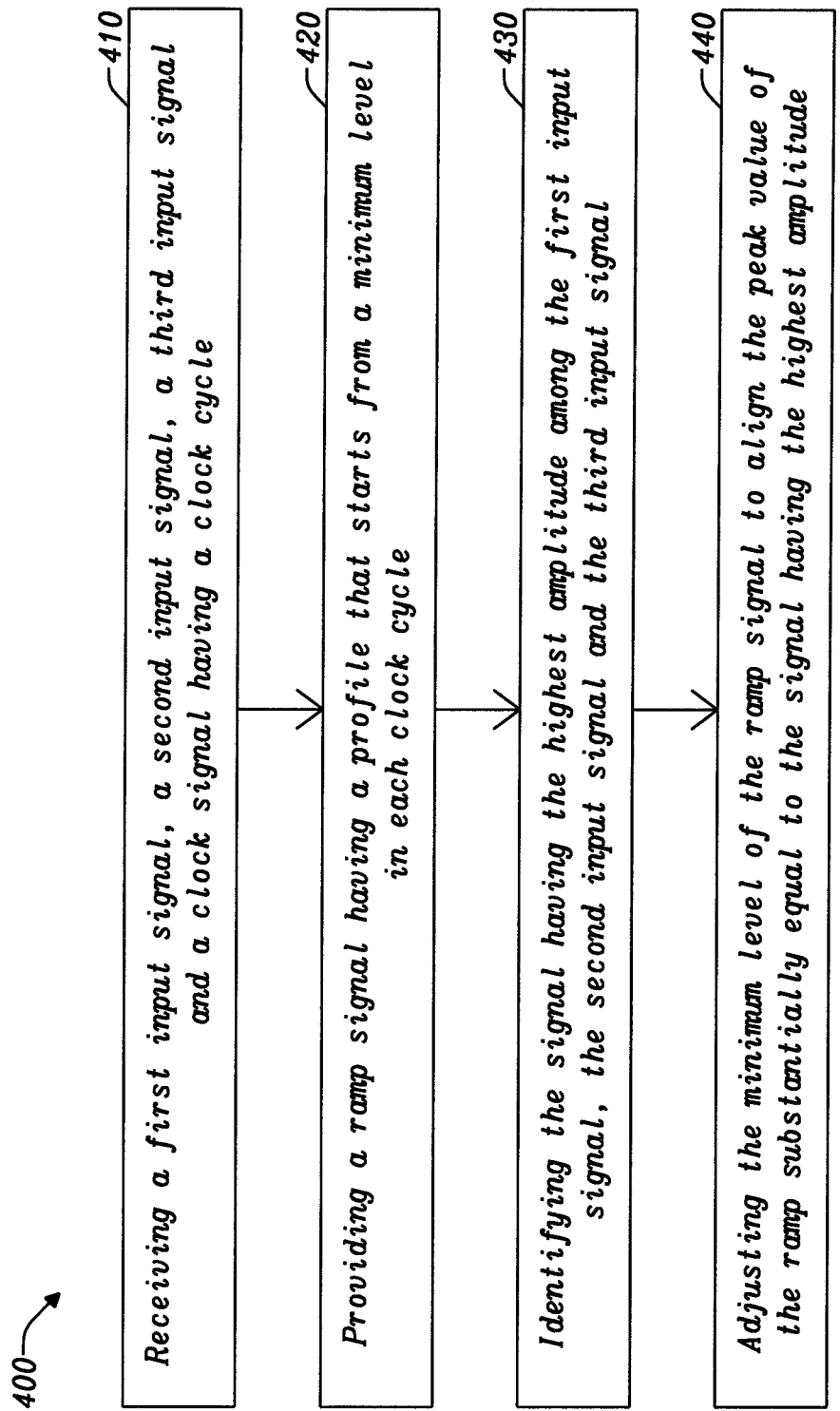
FIG. 4 is a flow chart of a method for modulating a signal according to the disclosure.

FIG. 4 is flow chart 400, of a method for modulating a signal according to the disclosure. At step 410, a first input signal, a second input signal, a third input signal and a clock signal having a clock cycle are received. For instance, the first and second input signals may derive from a single signal such that the second signal is equal to the first signal shifted by 180 degrees, hence having opposite-phase. For instance, the first and second signals may derive from an audio signal. The third signal may be a fixed level that sets the nominal duty cycle of the modulator.

At step 420, a ramp signal having a profile that starts from a minimum level in each clock cycle is provided. For instance, the ramp signal may have a triangular profile.

At step 430, the input signal having the highest amplitude among the first input signal, second input signal and third input signal is identified.

At step 440, the minimum level of the ramp signal is adjusted and the peak value of the ramp maintained substantially equal to the input signal having the highest amplitude from the first input signal, the second input signal or the third input signal.

Figure 5:
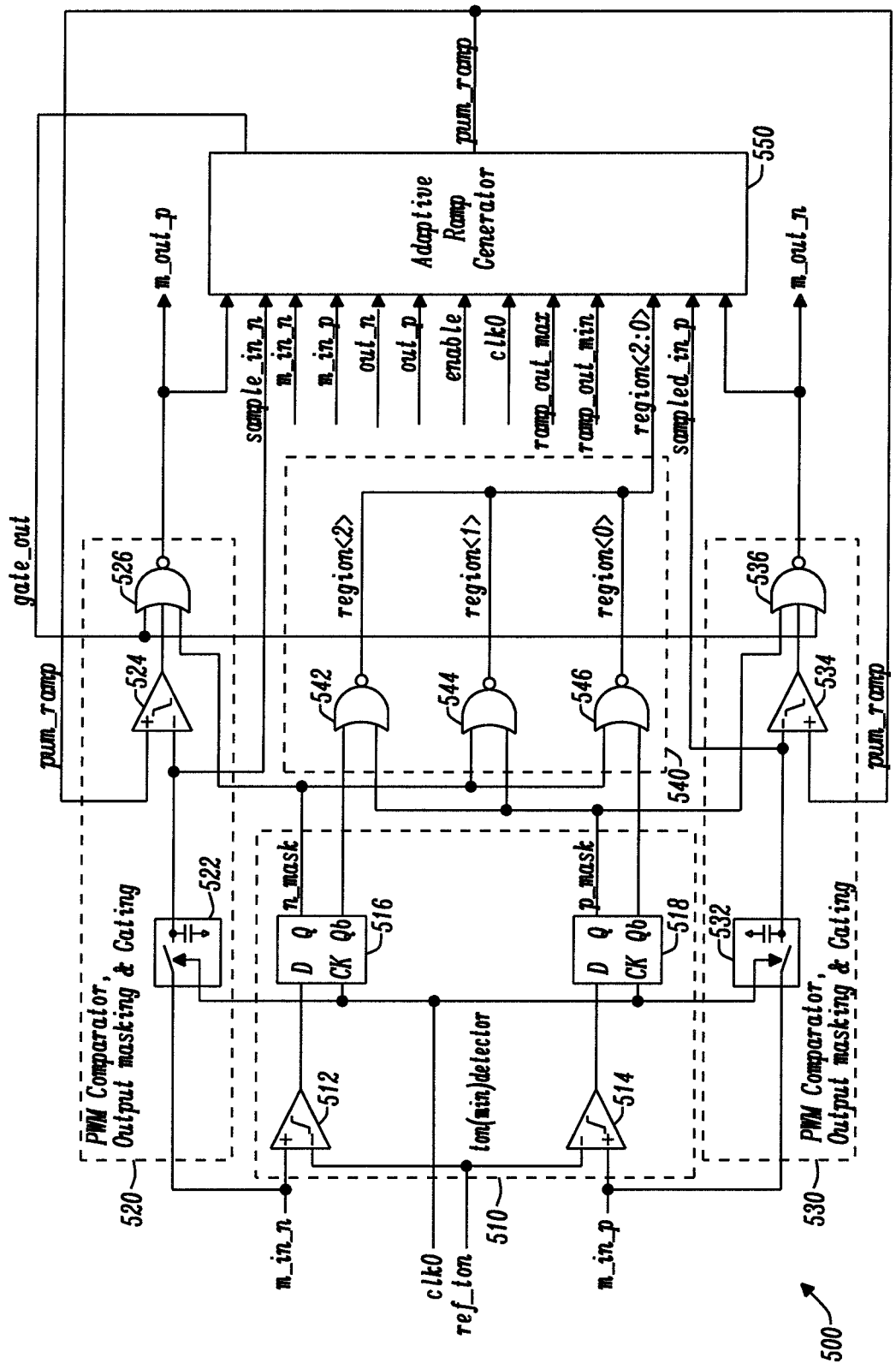
FIG. 5 is a diagram of a signal modulator for implementing the method of FIG. 4.

FIG. 5 describes a signal modulator 500 for implementing the method of FIG. 4. In this example the modulator 500 is a PWM modulator that includes an input stage 510, an adaptive ramp generator 550; and a comparative stage formed by sub-comparator circuits 520 and 530 respectively. The input stage 510 includes a first comparator 512 coupled to a first memory cell such as a D-flipflop 516; and a second comparator 514, coupled to a second memory cell or D-flipflop 518.

The comparator 512 has a non-inverting input for receiving a first input signal m_in_n, an inverting input for receiving a reference ref_ton and an output coupled to the data input D of the D-flipflop 516. Similarly, the second comparator 514 has a non-inverting input for receiving a second input signal m_in_p, an inverting input for receiving the reference ref_ton and an output coupled to the data input D of the second D-flipflop 518. Each one of the first and second D-flipflops 516, 518 includes a data input D, a clock input CK, a first output Q and a second output Qb corresponding to the complement of the first output Q. The clock input of the first and second D-flipflops are coupled together to receive a same clock signal clk0. The clock signal clk0 has a switching frequency which may be referred to as PWM frequency.

The first sub-comparator circuit 520 includes a sample and hold circuit 522, a comparator 524 and optionally a three-input NOR gate 526. The sample and hold circuit 522 samples input m_in_n at the start of the clk0 clock cycle and holds the sampled value for the duration of the clk0 clock period. Techniques for implementing sample and hold circuit 522 are well known to those versed in the art. The comparator 524 has an inverting input coupled to the output of the sample and hold circuit 522; a non-inverting input coupled to an output of the adaptive ramp generator 550 for receiving a ramp signal pwm_ramp. The three-input NOR gate 526 has a first input for receiving a gate_out signal from the adaptive ramp generator 550, a second input coupled to the output of the comparator 524 and a third input coupled to the output Q of the D-flipflop 516.

Similarly, the second sub-comparator circuit 530 includes a sample and hold circuit 532, a comparator 534 and optionally a three-input NOR gate 536. The sample and hold circuit 532 samples input m_in_p at the start of the clk0 clock cycle and holds the sampled value for the duration of the clk0 clock period. Techniques for implementing sample and hold circuit 532 are well known to those versed in the art. The comparator 534 has an inverting input coupled to the output of the sample and hold circuit 532; a non-inverting input coupled to an output of the adaptive ramp generator 550 for receiving the ramp signal pwm_ramp. The three-input NOR gate 536 has a first input for receiving the gate_out signal from the adaptive ramp generator 550, a second input coupled to the output of the comparator 534 and a third input coupled to the output Q of the D-flipflop 518.

Optionally, an operation region identifier 540 may be provided at the output of the input stage 510 for identifying a region of operation of the modulator. The identifier 540 is formed by a set of NOR gates 542, 544 and 546. The first NOR gate 542 has a first input coupled to the output Qb of D-flipflop 516 and a second input coupled to the output Q of the second D-flipflop 518. The first NOR gate 542 provides a logic signal region<2>. The second NOR gate 544 has a first input coupled to the output Q of the first D-flipflop 516 and a second input coupled to the output Q of the second D-flipflop 518. The second NOR gate 544 provides a logic signal region<1>. The third NOR gate 546 has a first input coupled to the output Q of the first D-flipflop 516 and a second input coupled to the output Qb of the D-flipflop 518. The third NOR gate 546 provides a logic signal region<0>.

The adaptive ramp generator 550 has a plurality of inputs and two outputs for providing the ramp signal pwm_ramp and optionally the blocking signal gate_out. In this example, the adaptive ramp generator has 12 inputs and additional inputs formed in a 3-bit bus for receiving the first and second input signals m_in_n and m_in_p, the clock signal clk0; the modulated signal m_out_p from the sub_comparator circuit 520; the modulated signal m_out_n from the sub_comparator circuit 530; the sampled_in_n signal from the sample and hold circuit 522; the sampled_in_p signal from the sample and hold circuit 532; extrema signals ramp_out_min and ramp_out_max; and an enable signal for enabling the ramp generator. The signals ref_ton, ref_toff, ramp_out_min, and ramp_out_max may derive from the supply voltage also referred to as input voltage yin described with respect to FIG. 1. For instance, in FIG. 1 a resistive ladder with multiple outputs may be used generate these signals. As a result, the reference signals ref_ton, ref_toff, ramp_out_min, and ramp_out_max may be fixed with respect to the supply voltage and decrease when the supply voltage decreases. The value of ref_ton may be chosen to be as high as possible to reduce power consumption to a minimum, yet sufficiently low to provide enough head room for the system to work, for example, to allow for offsets in comparators.

Optionally, the adaptive ramp generator 550 may also receive, the signal region <2:0> formed by the outputs of the NOR gates 542, 544 and 546; as well as first and second half bridge outputs out_n and out_p from a power stage. For instance, out_n may originate from half-bridge 130 and out_p may originate from half-bridge 150 of FIG. 1.

In operation, the sample and hold circuits 522 and 532 sample the first and second input signals m_in_n and m_in_p at the beginning of a PWM cycle; hence producing the sampled signal sampled_in_n and sampled_in_p respectively. Each sampled signal is held constant for the duration of the PWM cycle.

The adaptive ramp generator 550 generates a modified ramp signal pwm_ramp in each PWM cycle, by aligning the peak value of the ramp signal with the maximum value of the sampled input signals or the ramp_out_max signal. This allows correcting for non-linear effects that would otherwise occur due to output power stage clamping and minimum pulse width gating. Optionally, the adaptive ramp generator may also generate a gating signal gate_out corresponding to a minimum pulse width for driving the output stage.

The input stage 510 receives the first and second input signals m_in_n and m_in_p, and the reference ref_ton; and generates a first comparator signal associated with m_in_n and a second comparator signal associated with m_in_p. The first and second comparator signals are then fed to the D_flipflop 516 and 518 to generate a first mask signal n_mask when m_in_n is greater than ref_ton; and a second mask signal p_mask when m_in_p is greater than ref_ton. The D-flipflops being clocked, the mask signals or pulses n_mask and p_mask are formed at the beginning of the PWM cycle and last for the duration of the PWM cycle.

The first comparator 524 of sub-comparator 520 receives the first sampled input sampled_in_n and the pwm_ramp signal and provides the modulated signal m_out_p at the output of NOR gate 526. The modulated output signal may be blocked by the NOR gate 526 if either one of the gate_out signal or n_mask signal is high, for instance logic 1. Similarly, the second comparator 534 of sub-comparator 530 receives the second sampled input sampled_in_p and the pwm_ramp signal and provides the modulated signal m_out_n at the output of NOR gate 536. The modulated output signal m_out_n may be blocked by the NOR gate 536 if either one of the gate_out signal or p_mask signal is high, for instance logic 1. Therefore, either one of the PWM outputs m_out_p and m_out_n is forced to the off state when the corresponding masking signal, n_mask or p_mask is asserted. As illustrated in FIG. 1, the modulated output signals m_out_n and m_out_p may be used to drive a PWM power stage in a class D amplifier.

The modulator 500 may operate in three different regions depending on the level of the input signal with respect to ref_ton. The set of logic gates 542, 544 and 546 may be used to identify a first region referred to as region<0>, when the input signal m_in_p is above ref_ton and m_in_n is less than ref_ton; a second region referred to as region<1>, when the input m_in_p and m_in_n are both below ref_ton and a third region referred to as region<2>, when m_in_p is less than ref_ton and m_in_n is greater than ref_ton. For instance, these regions may be used by the adaptive ramp generator 550 to calculate a duty-cycle distortion correction coefficient.

When the modulator operates in the first region (region<0>), the minimum level of the ramp signal is set equal to the amplitude of signal m_input_p minus the maximum absolute amplitude of the ramp profile. When the modulator operates in the third region (region<2>), the minimum level of the ramp signal is set equal to the amplitude of signal m_input_n minus the maximum absolute amplitude of the ramp profile. When the modulator operates in the second region (region <1>), the minimum level is set to a predetermined value that results in a low duty cycle.

The modulator 500 combines several advantages. By adjusting adaptively the ramp signal in each clock cycle, a transfer function with low distortion is obtained without the need for a high-order loop filter. The modulator 500 also allows maintaining a constant gain over an extended range, hence further mitigating distortion. In addition, by implementing output clamping of the signal with a defined threshold, current consumption is reduced within the system.

Figure 6:
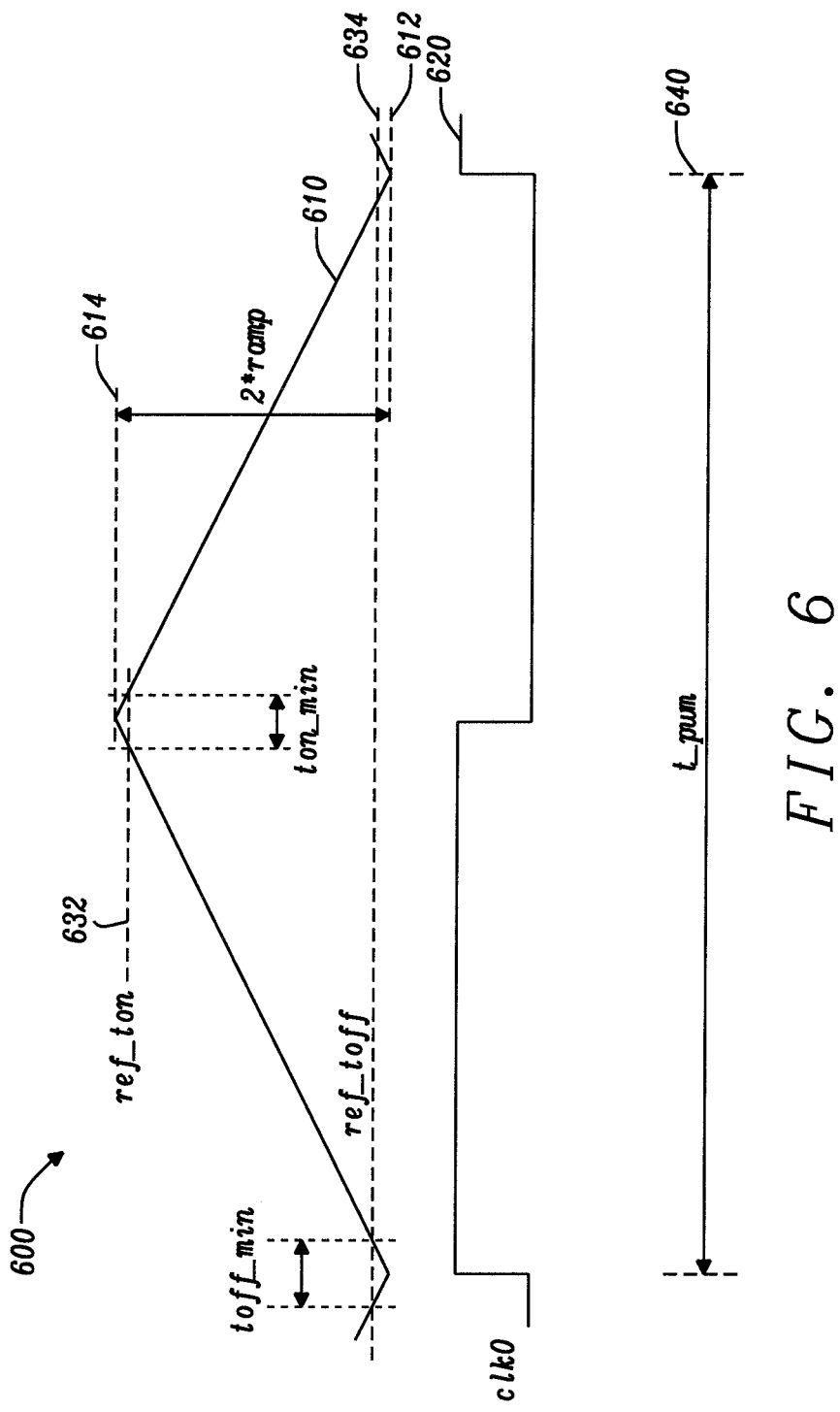
FIG. 6 is a ramp signal having a triangular profile.

FIG. 6 illustrates 600, with a ramp signal 610 having a triangular profile together with a clock signal 620 having PWM frequency f_pwm and a PWM period t_pwm 640. In each clock cycle the ramp signal increases between a minimum level 612 and a maximum level 614 for the first half period and decreases from the maximum to the minimum level during the second half period. At midpoint the ramp signal reaches its maximum absolute amplitude or peak value. A first reference level ref_ton 632 is used to define a minimum ton window ton_min when the ramp signal 610 is above ref_ton 632. Similarly, a second reference ref_toff 634 is used to define a minimum toff window toff_min when the ramp signal 610 is below ref_toff 634.

Figure 7:
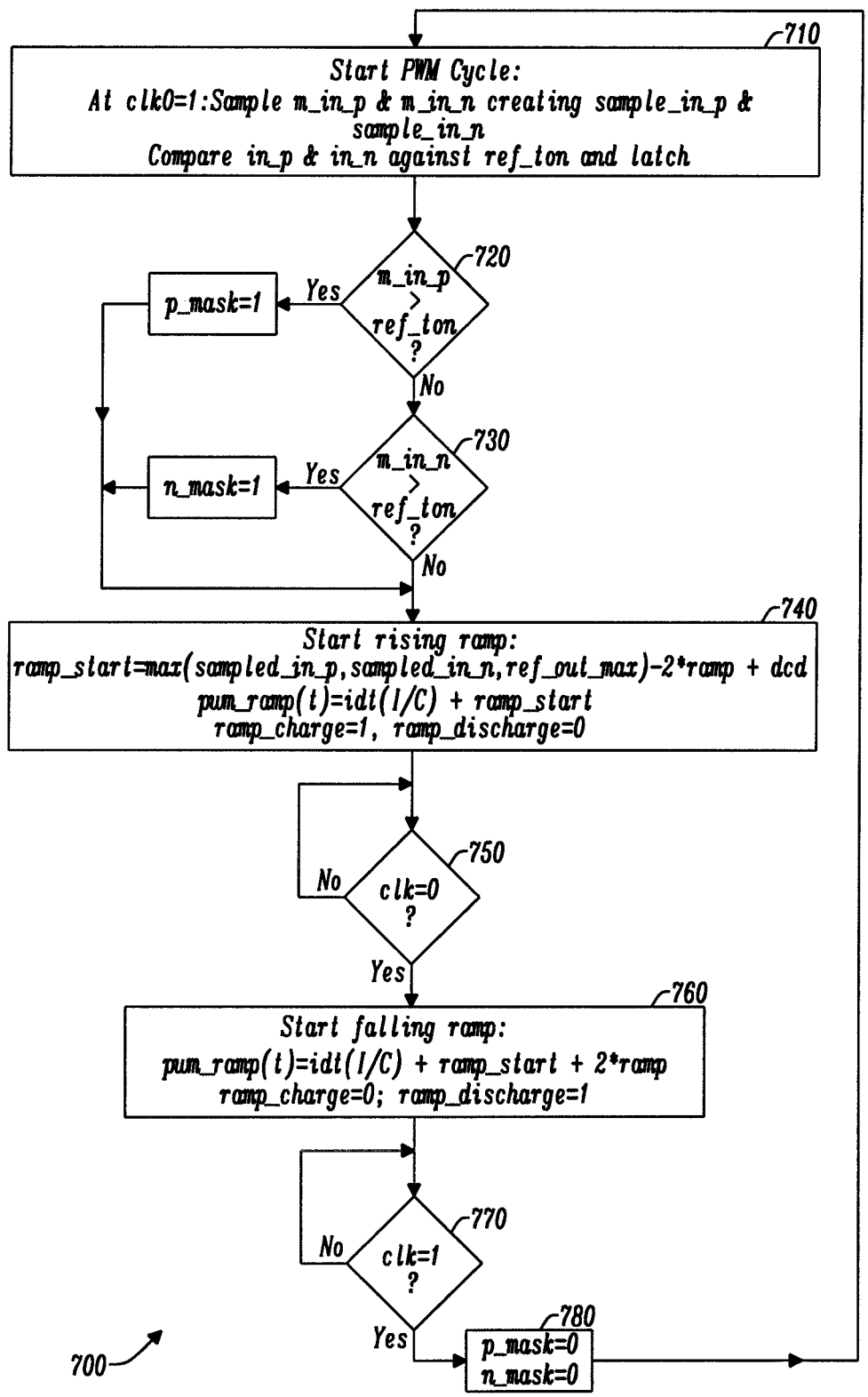
FIG. 7 is a flow diagram for generating an adjusted ramp signal.

FIG. 7 illustrates a flow diagram 700, for generating an adjusted ramp signal according to the disclosure. At step 710 a PWM cycle starts, the sample and hold circuits 522 and 532 sample the inputs m_in_n and m_in_p respectively. At steps 720 and 730 the input stage 510 compares the input signals m_in_p and m_in_n with the reference ref_ton. If m_in_p is greater than ref_ton, then the logic signal p_mask=1; if m_in_n is greater than ref_ton, then the logic signal n_mask=1.

At step 740 the adaptive ramp generator 550 calculates a minimum level for starting the ramp signal. The minimum level is defined as the maximum input amplitude, selected among the first input signal, the second input signal and the reference signal ramp_out_max, minus the maximum value or peak value of the ramp signal. Optionally the calculation of the minimum level may be corrected by adding a duty-cycle distortion coefficient DCD. The ramp signal has a linear rise and a linear fall. Depending on the implementation, the rise and fall of the ramp signal may follow the charge and discharge of a capacitor circuit. In this way, the peak of the ramp signal is maintained at the higher of the two sampled input signals, sample_in_p and sample_in_n or the reference signal ramp_out_max.

At step 740 the ramp signal rises linearly up to the maximum level, at which point the clock signal goes low (step 750). At step 760 the ramp signal falls linearly down to the minimum level, at which point the clock signal goes high (step 770). At the end of the clock cycle (step 780) the mask signals are set to zero.

Figure 8:
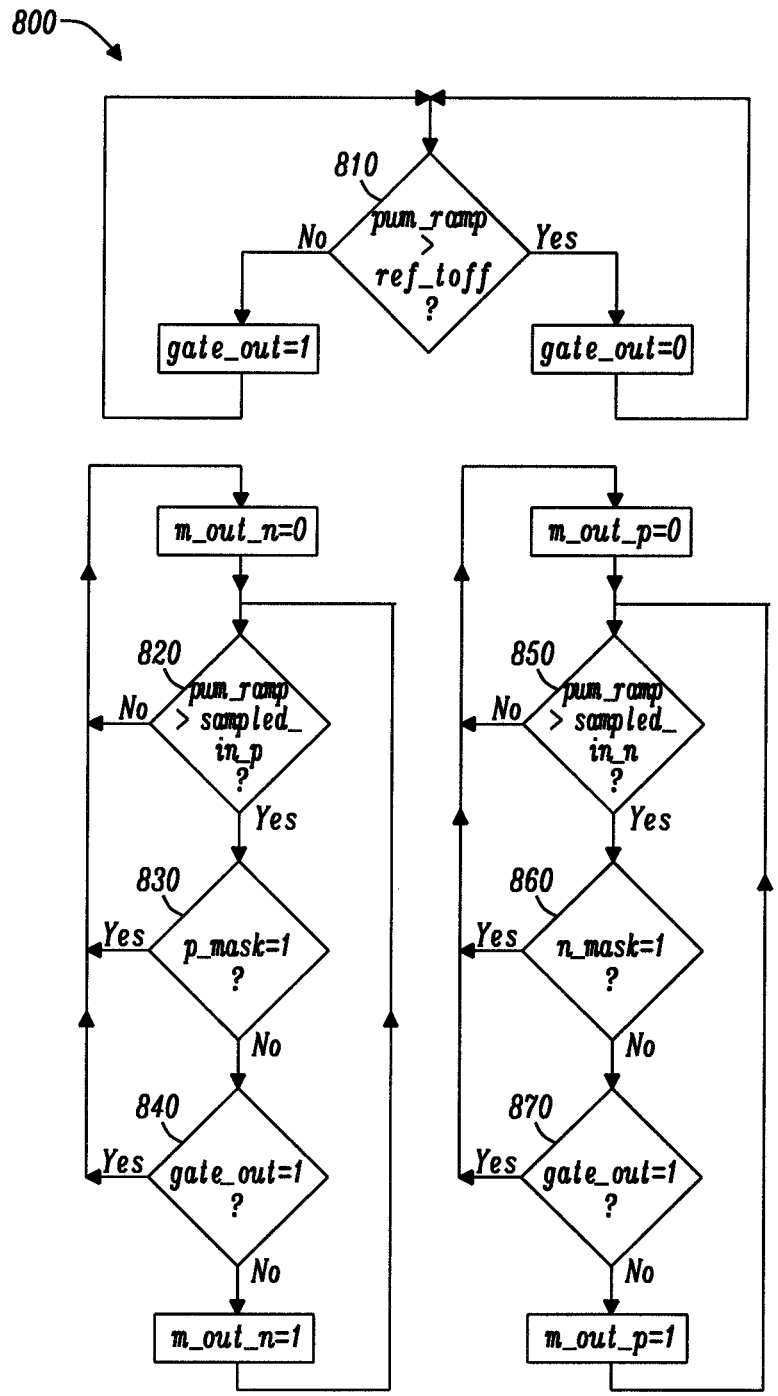
FIG. 8 is a flow chart illustrating a method of generating a modulated signal using the modulator of FIG. 5.

FIG. 8 is a flow chart 800, illustrating a method of generating a modulated signal using the modulator of FIG. 5. At step 810, the adaptive ramp generator 550 compares the ramp signal with respect to the ref_toff. If the ramp signal is less than the ref_toff, then the adaptive ramp generator 550 outputs the signal gate_out=1. Alternatively when the ramp signal is greater than the ref_toff, then the adaptive ramp generator 550 outputs the signal gate_out=0.

The adaptive ramp generator 550 continually compares the sample input signals, sample_in_n and sample_in_p with the pwm_ramp signal to produce the modulator signal m_out_p and m_out_n respectively. The output signal is high when the pwm_ramp exceeds the sampled input, as long as the input signal is below the ref_ton level and above the ref_toff level. This is illustrated by the steps 820, 830 and 840 for the modulated signal m_out_n. At step 830, if the mask signal is asserted, then the modulated signal m_out_n is blocked, hence set to zero. At step 840, if the gating signal gate_out is asserted, then the modulated signal m_out_n is blocked, hence set to zero. Corresponding steps 850, 860 and 870 are implemented for modulated signal m_out_p.

Figure 9:
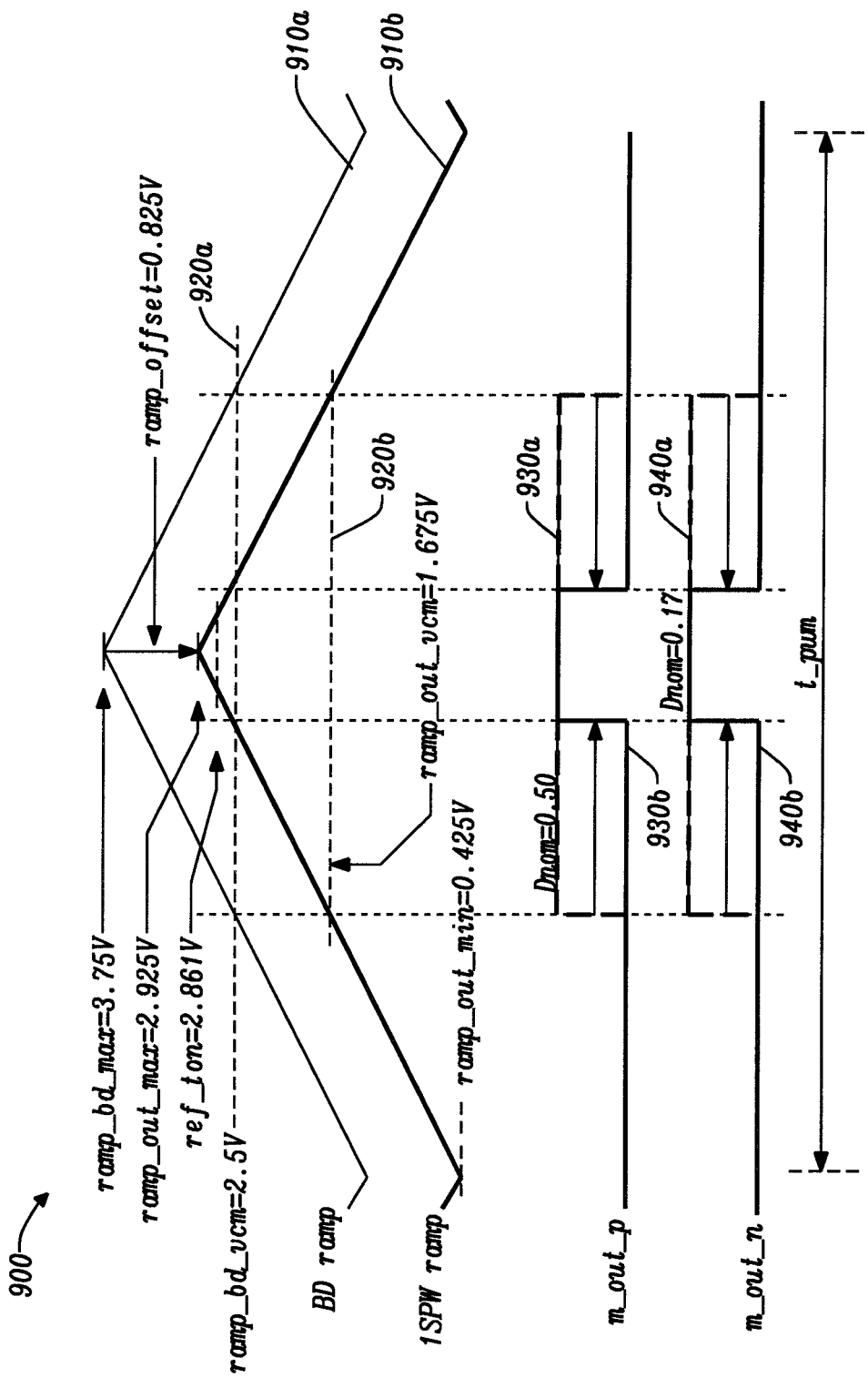
FIG. 9 is a modulated ramp signal.

FIG. 9 illustrates 900, with two ramp signals shifted with respect to each other, together with the modulated output signals. The first ramp signal 910a also referred to as BD ramp signal is associated with a common mode voltage of 2.5V. The outputs of the modulator in this case, are signals 930a and 940a having a nominal duty cycle Dnom of 0.5 or 50%. The second ramp signal 910b, also referred to as 1SPW ramp signal is shifted down with respect to the first ramp signal 910a by a ramp offset value in this example of 0.825V. The second ramp signal 910b is associated with a common mode voltage of 1.675V. The outputs of the modulator in this case, are signals 930b and 940b having a nominal duty cycle Dnom of 0.17 or 17%.

Figure 10:
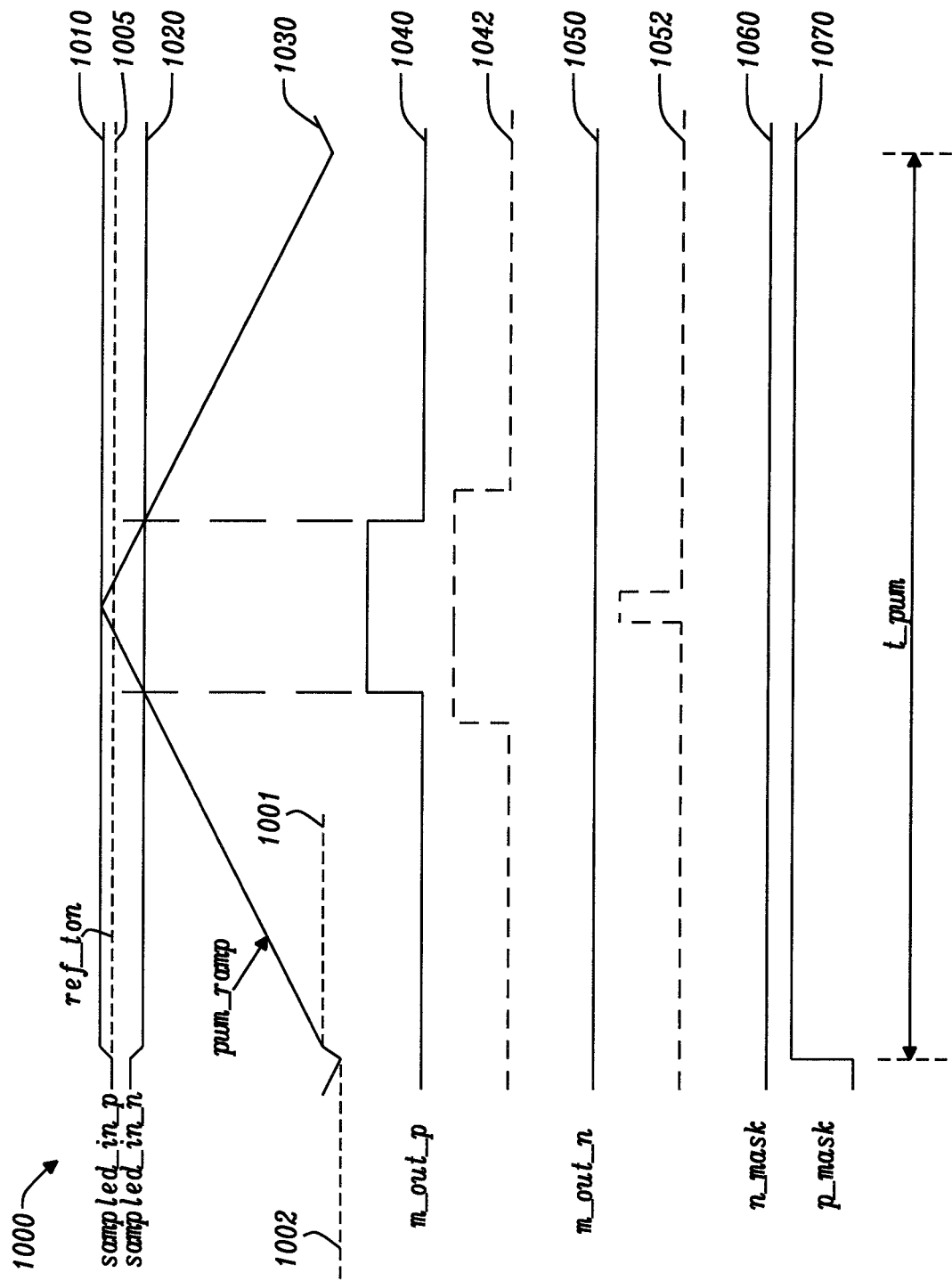
FIG. 10 is a timing diagram illustrating the working of the modulator of FIG. 5.

FIG. 10 is timing diagram 1000, illustrating the working of the modulator of FIG. 5. FIG. 10 shows the sampled input signals sampled_in_p 1010 and sampled_in_n 1020, the pwm_ramp signal 1030, the modulated output signals m_out_n 1050 and m_out_p 1040, as well as the mask signals n_mask 1060 and p_mask 1070. Also illustrated are the modulated output signals m_out_p 1042 and m_out_n 1052 from the previous cycle and the ref_ton 1005 reference.

At the start of a new cycle the input signal has increased. In this example, the sampled_in_p signal 1010 increases from a level slightly below ref_ton to being slightly above the ref_ton 1005. The peak of the ramp signal 1030 is now aligned with the sampled input signal sampled_in_p 1010. As a result, the minimum level of the ramp signal 1001 in the new cycle is higher than the minimum level in the previous cycle 1002. The width of the pulse 1040 has been reduced compared to the width of the pulse 1042 in the previous cycle. Since the sampled_in_p signal 1010 is above the reference level ref_ton, the output signal m_out_n 1050 is deemed too narrow for operating the power stage and is masked by the mask signal p_mask 1070.

The width of the pulse 1040 m_out_p is reduced to compensate for the lost pulse 1050 and may be narrower than pulse 1042 of the previous cycle.

Figure 11:
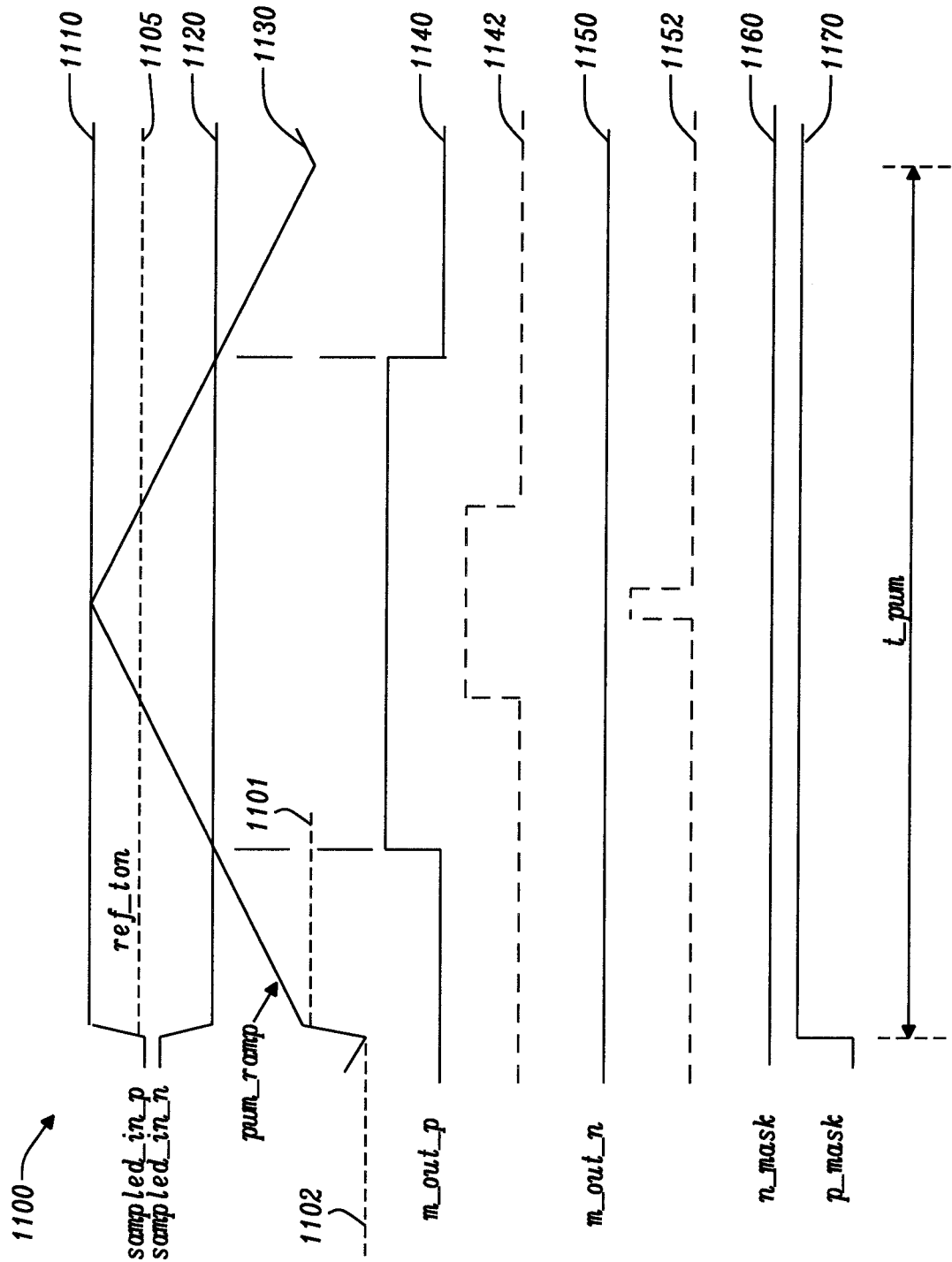
FIG. 11 is another timing diagram illustrating the working of the modulator of FIG. 5.

FIG. 11 illustrates another timing diagram 1100, for illustrating the working of the modulator of FIG. 5. FIG. 11 shows the sampled_in_p signal 1110, the sampled_in_n signal 1120, the pwm_ramp signal 1130, the modulated outputs m_out_p 1140, and m_out_n 1150. Also illustrated are the modulated output signals m_out_p 1142 and m_out_p 1152 from the previous cycle. In this scenario, the input signal increases from being slightly below ref_ton to being well above ref_ton. The width of output signal 1140 m_out_p increases following the modular input sampled_in_n. The output signal m_out_n 1150 is masked.

Figure 12:
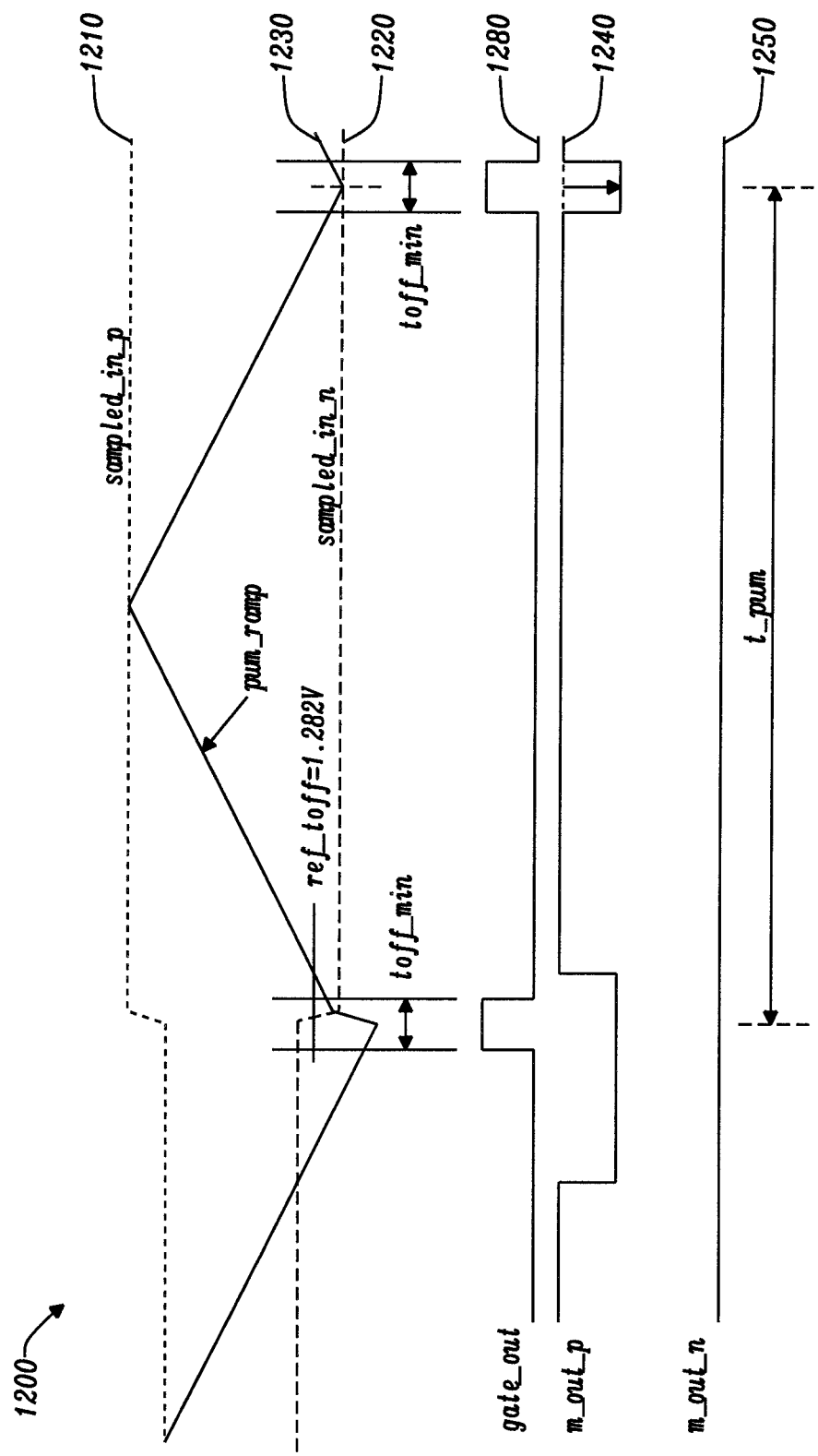
FIG. 12 is yet another timing diagram illustrating the working of the modulator of FIG. 5.

FIG. 12 illustrates yet another timing diagram 1200, showing sampled_in_p 1210, sampled_in_n 1220, pwm_ramp signal 1230, output signals m_out_p 1240, and m_out_n 1250 as well as the gate_out signal 1280. In this scenario, the modulator input increases to a maximum output duty cycle restriction. At this point, a signal gate_out 1280 forces the remaining output signal 1240 low.

Figure 13:
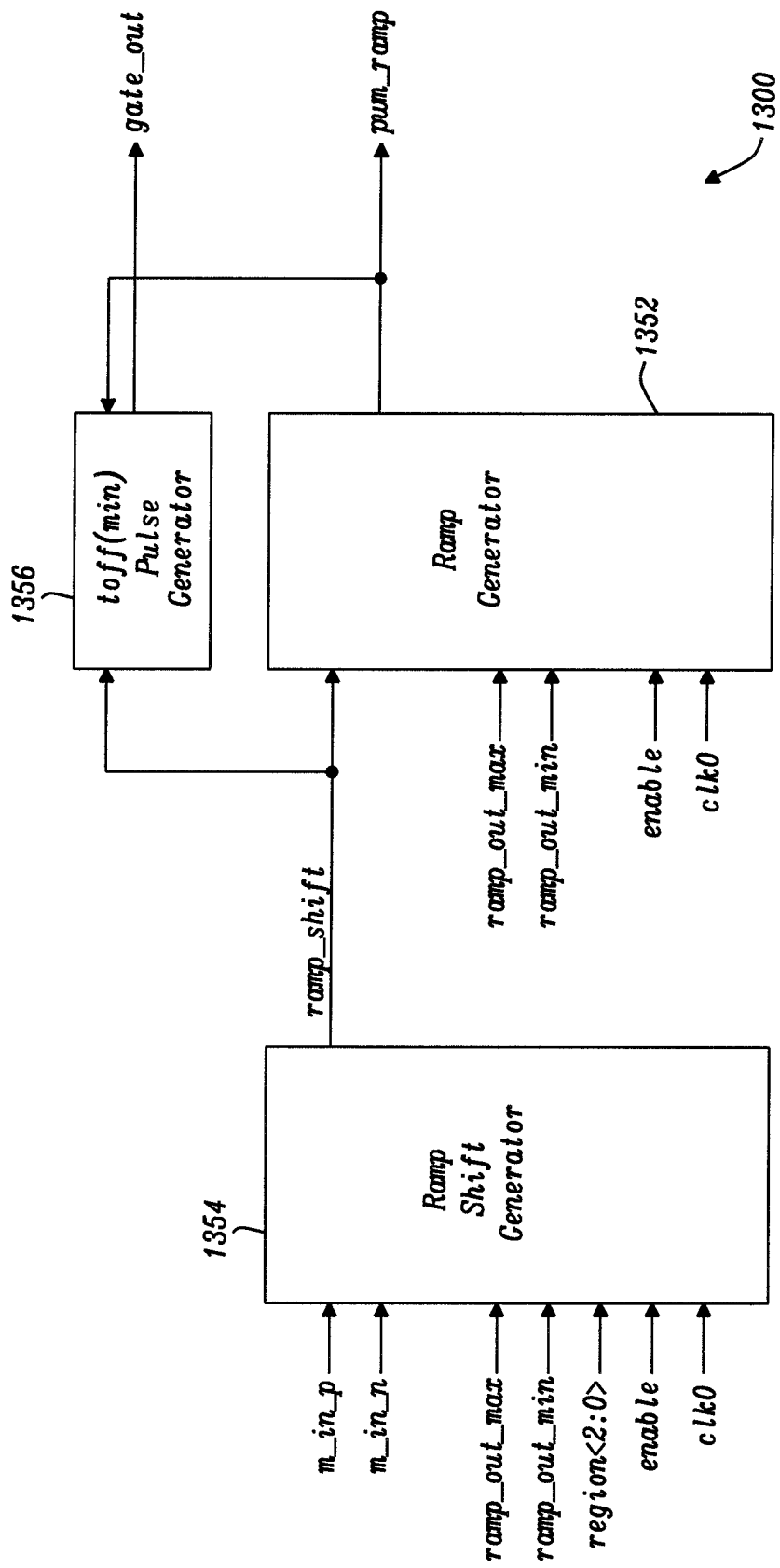
FIG. 13 is a diagram of an adaptive ramp generator for use in the circuit of FIG. 5.

FIG. 13 is an exemplary embodiment of an adaptive ramp generator for use in the circuit of FIG. 5. In this example the ramp generator is operating without DCD correction. The circuit 1300 includes a ramp generator 1352 coupled to a ramp shift generator 1354 and a pulse generator 1356. The ramp shift generator 1354 has seven inputs for receiving input signals m_in_p and m_in_n, a ramp minimum value signal ramp_out_min, a ramp maximum value signal ramp_out_max, a region signal region<2:0>, an enable signal and a clock clk0. The ramp shift generator 1354 has an output for providing a ramp_shift signal.

The ramp generator circuit 1352 has five inputs for receiving the clock signal clk0, the enable signal, the extrema signals ramp_out_min and ramp_out_max signal, as well as the ramp_shift signal from the ramp shift generator 1354. The ramp generator 1352 has an output for providing the adjusted pwm_ramp signal.

The pulse generator circuit 1356 has two inputs for receiving the ramp_shift from the ramp shift generator 1354 and the pwm_ramp signal from the ramp generator 1352. The pulse generator 1356 is adapted to provide a gating signal gate_out.

In operation the ramp shift generator 1354 receives the m_in_p and m_in_n signals and the ramp_out_max signal and calculates the minimum level or starting level for the ramp signal. As described above the starting value of the ramp maintains the peak of the PWM ramp signal at the highest level of the two sampled input signals and the ramp_out_max signal. The ramp generator 1352 produces a ramp signal having a periodic linear profile such as a triangular ramp signal. The pulse generator 1356 compares the ramp signal from the ramp generator 1352 with the reference derived from the ramp_shift signal equivalent to the ref_toff threshold to output the gating signal gate_out.

In this embodiment, two circuits operate on alternate PWM cycles, namely odd and even cycles. This alleviates the timing constraints on resetting the ramp generator at each PWM cycle. However, it would be appreciated that the adaptive ramp generator may be implemented without using such time multiplexing technique.

The ramp generator 1352 may include a linear current source and a capacitor. A linear voltage ramp may therefore be achieved by charging the capacitor with the linear current. The pulse generator 1356, also referred to as minimum off pulse generator produces the gate_out output signal when the ramp is below the sample input signal.

Figure 14:
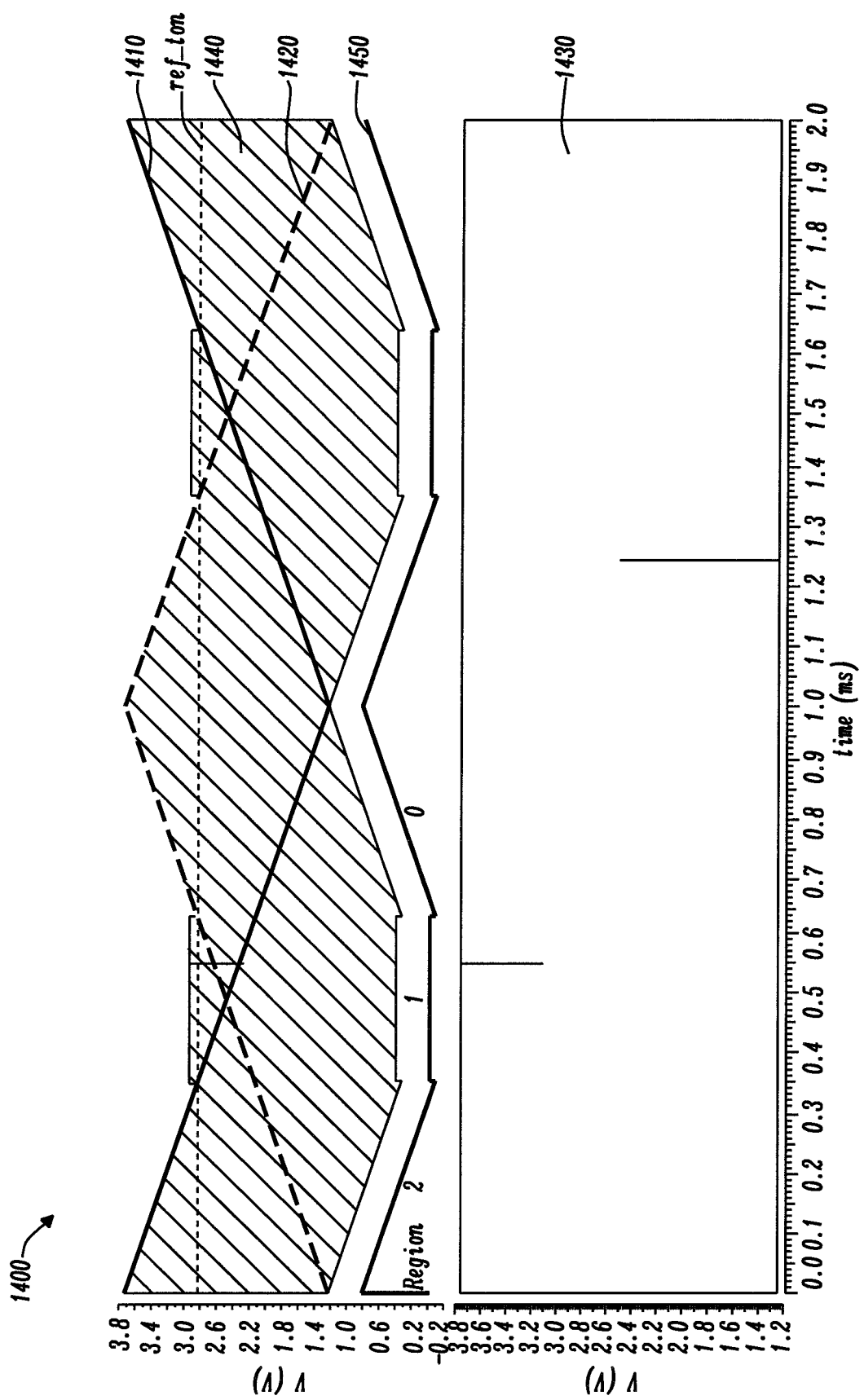
FIG. 14 is a simulation of an adjusted ramp signal.

FIG. 14 is simulation 1400, of an adjusted ramp signal. FIG. 14 shows a first input signal 1410, a second input signal 1420, an input ramp signal 1430 and the pwm_ramp signal 1440. FIG. 14 also illustrates the shift levels 1450 of the ramp signal representing an amount by which the ramp DC level is shifted in each cycle. The first input signal 1410 corresponds to m_in_n and the second input signal 1420 corresponds to m_in_p. Three regions can be identified labelled region<0>, region<1> and region<2>. In region<0>, m_in_p 1420 is greater than ref_ton and m_in_n 1410 is less than ref_ton, and the peak of the ramp outputs follow the m_in_p signal. In the second region, region<1>, m_in_p 1420 is less than ref_ton and m_in_n 1410 is less than ref_ton. The peak of the ramp output signal remains constant at a level consistent with the nominal duty cycle of 17%. Finally, region<2> corresponds to the m_in_p 1420 being less than the ref_ton and m_in_n 1410 greater than ref_ton. The peak of the ramp output signal follows the m_in_n signal. A vertical step in the pwm_ramp signal 1440 appears between region<2> and region<1>, and between region<1> and region<0>. This step corrects for the lost pulse at the boundaries between regions.

Figure 15:
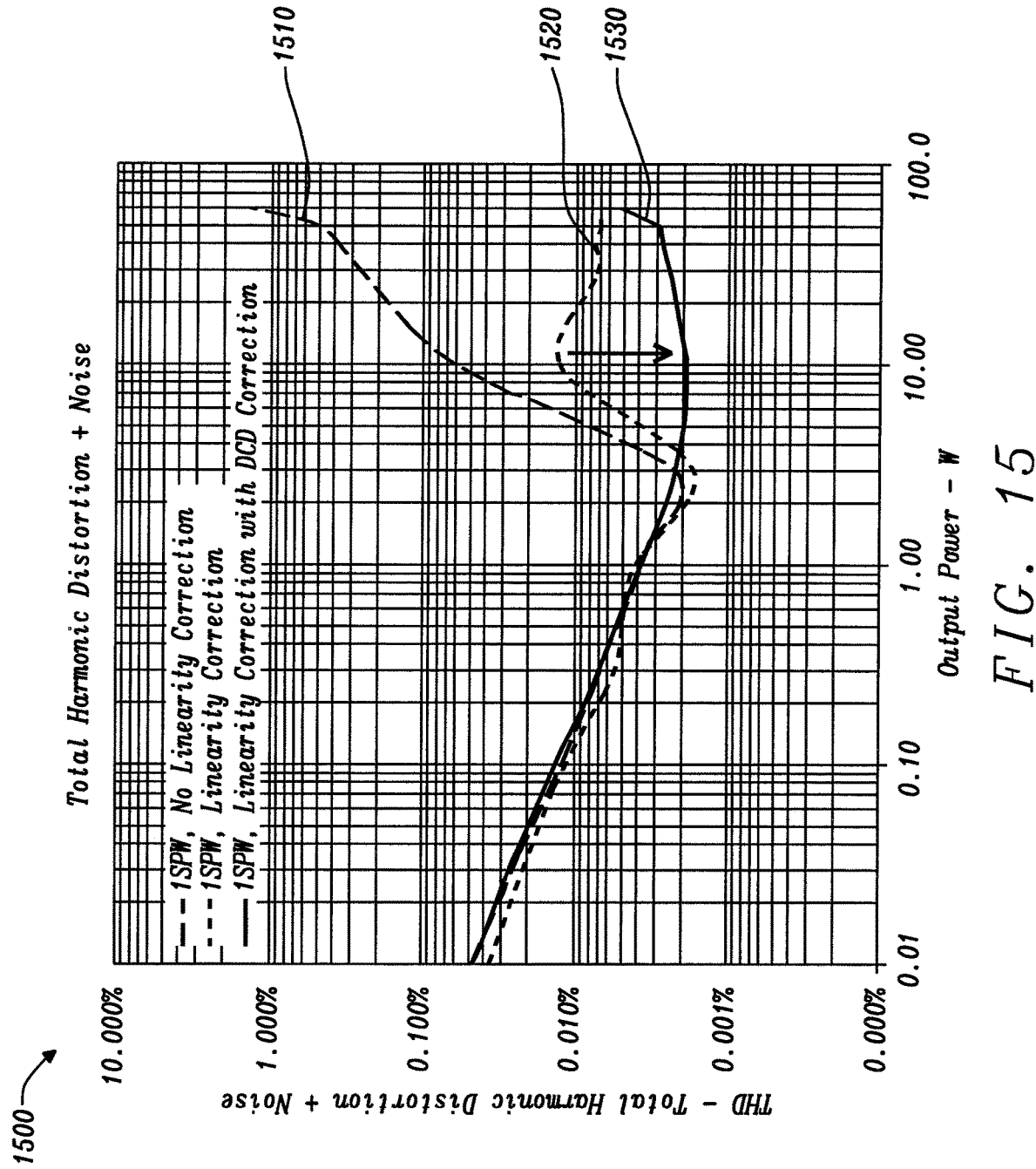
FIG. 15 is a simulation of a total harmonic distortion obtained with a conventional modulator and with the modulator according to the disclosure.

FIG. 15 is a simulation 1500, of a total harmonic distortion THD obtained i) with a conventional 1SPW modulator, simulation 1510; ii) with the modulator according to the disclosure that includes linearity correction, simulation 1520, and iii) with the modulator according to the disclosure including both linearity correction and duty-cycle distortion DCD correction, simulation 1530.

The simulations were obtained for a full class-D amplifier with high-order loop filter. Transient noise simulations were run for a on 1 kHz input signal across various output power levels with a nominal duty-cycle Dnom=17% and a ton minimum signal of 50 nanoseconds. The main supply voltage was 24V, allowing output power levels up to 60 W, with a 4 Ohm load.

By comparing the simulations 1510 and 1520, it can be observed that at power level above ref_ton threshold, that is above about 3 W, the new modulator provides clear improvement on distortion. At the highest power level, in the region of 60 W, the distortion rises above 1%, for simulation 1510; however, the distortion obtained for the modulator of the disclosure is less than 0.01%. The simulation 1520 also illustrates that the distortion increases above 3 W due to duty-cycle distortion DCD in the power stage. This can be corrected by including a correction term to the PWM ramp, as illustrated in simulation 1530 with distortion dropping further to 0.002%.

Duty-cycle distortion DCD occurs when the output duty cycle of an input signal entering a device differs from the output duty cycle of the output signal exiting the device.

Figure 16:
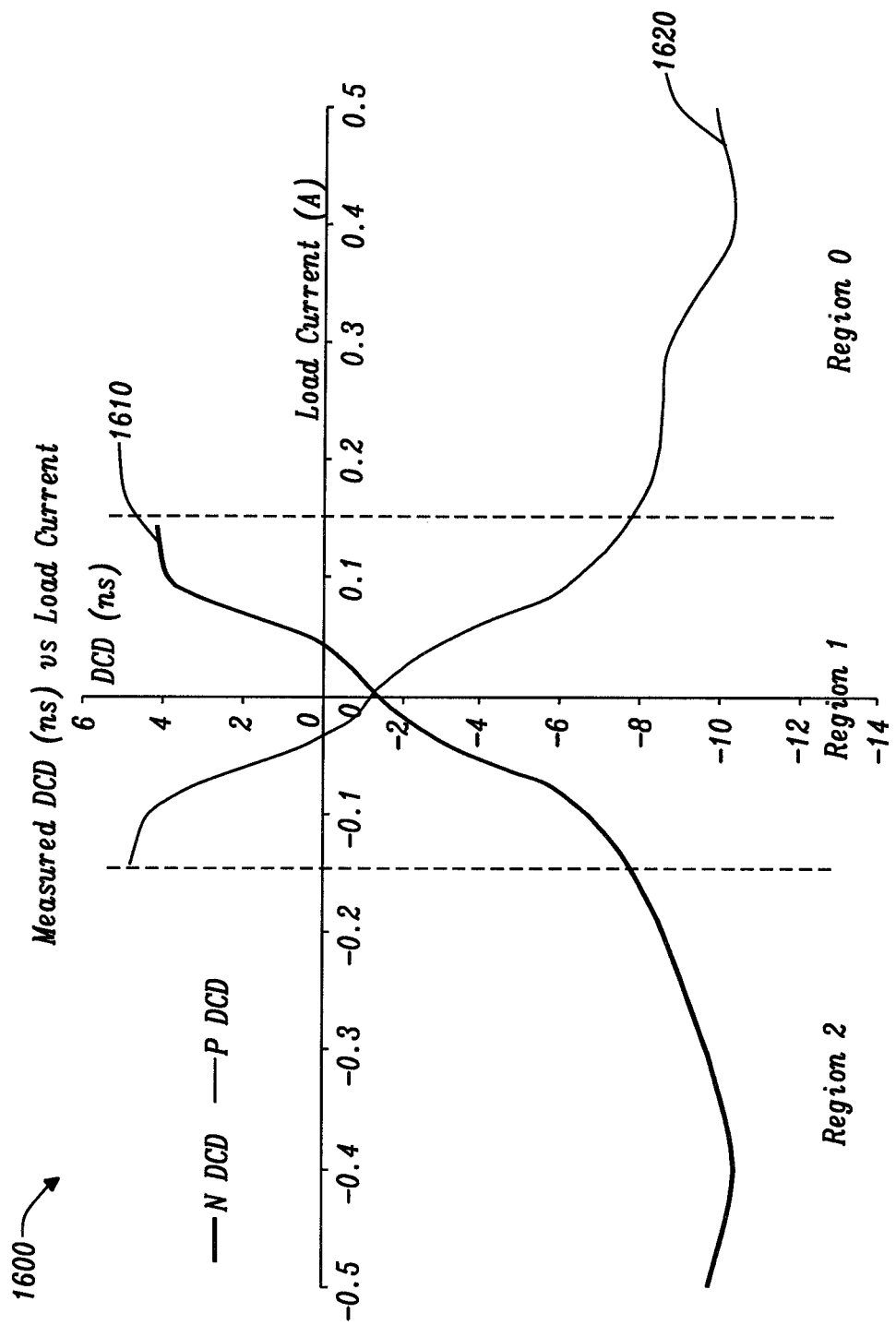
FIG. 16 is the measured duty-cycle distortion as a function of the load current obtained at the outputs of a full-bridge power stage.

FIG. 16 shows 1600, the measured duty-cycle distortion of the power stage used in simulations of FIG. 15 as a function of the load current obtained at the outputs of a full-bridge power stage. The measurement 1610 corresponds to the DCD obtained at the output out_n of the power stage, while the measurement 1620 corresponds to DCD obtained at the output out_p of the power stage. When the output current is close to zero, then so is the DCD. As the load current rises, the DCD associated with one output increases while the DCD associated with the other output decreases. When the load current reaches about 0.15 amps, the n_dcd 1610 disappears due to clamping. A similar effect is also noticed when the load current decreases down to −0.15 amps, in which case the p_dcd 1620 disappears due to output clamping. A correction term may be obtained by measuring the DCD at a load current level for which output clamping occurs.

Figure 17:
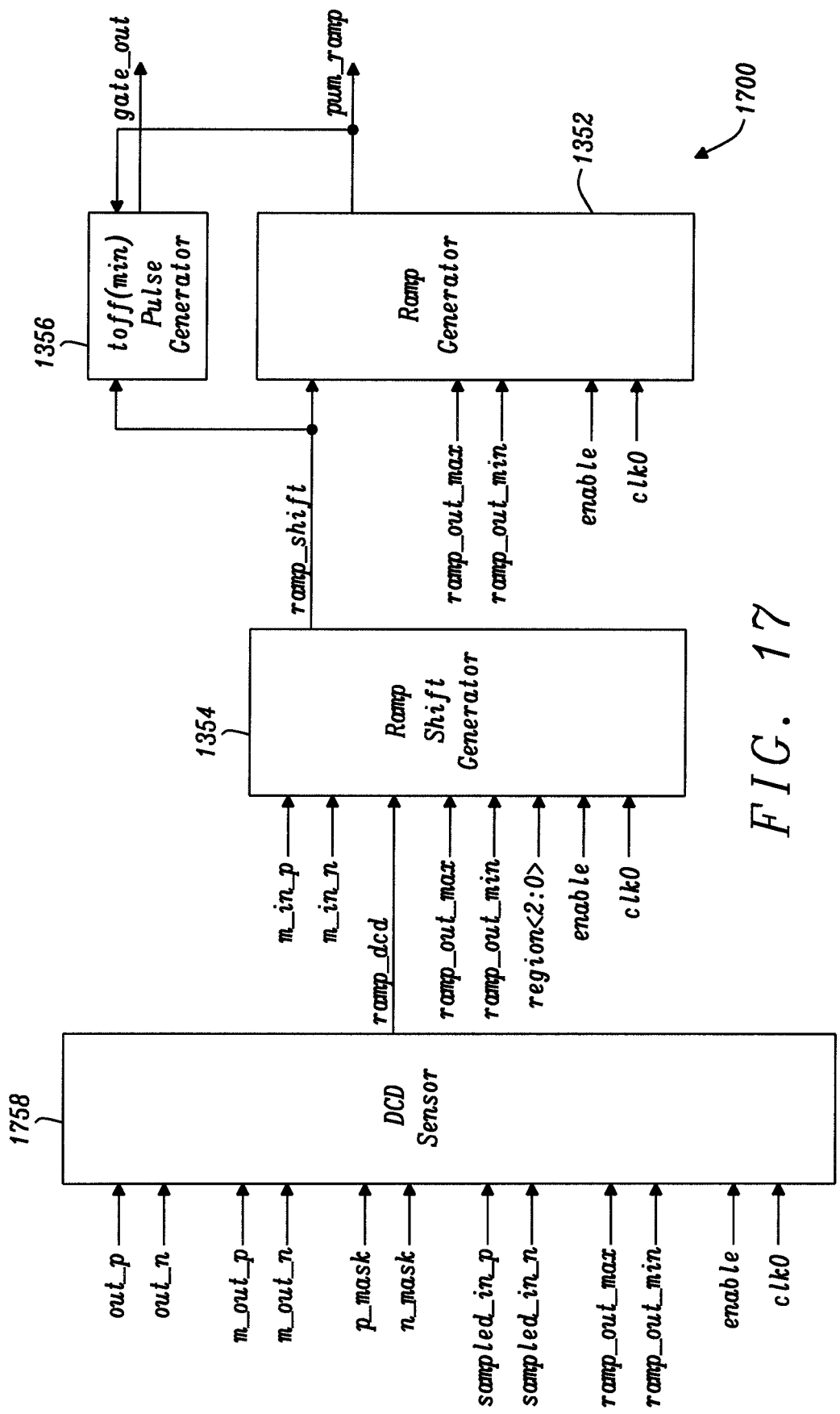
FIG. 17 is another adaptive ramp generator for use with the circuit of FIG. 5.

FIG. 17 illustrates another adaptive ramp generator for use with the circuit modulator of FIG. 5. The adaptive ramp generator 1700 shares similar features to those illustrated in the circuit of FIG. 13 and the same references are used to describe corresponding features. These will not be described again for the sake of brevity. In this example, the adaptive ramp generator 1700 includes a DCD sensor 1758 coupled to the ramp shift generator 1354.

The DCD sensor 1758 has 12 inputs for receiving the following signals:
out_p, out_n, m_out_p, m_out_n, p_mask, n_mask, sampled_in_p, sampled_in_n, ramp_out_max, ramp_out_min, enable and clk0 signals. The DCD sensor 1758 is configured to provide a DCD correction coefficient, to the ramp shift generator 1354 via the ramp_dcd signal. The DCD sensor may calculate or evaluate a duty cycle distortion by comparing the signal out_n provided by the first half bridge 130 with the first modulated signal m_out_n provided by the modulator; and by comparing the signal out_p provided by the second half bridge 150 with the second modulated signal m_out_p provided by the modulator.

The DCD sensor 1758 may include a current source to charge and discharge a capacitor. It may also include a time delay circuit. The DCD correction term may be stored as digital data words; however, it will be appreciated that the DCD correction term may also be implemented using analog signals which may be stored and subsequently used to represent DCD correction terms.

The DCD correction term is influenced by process variations, absolute output voltage, temperature and supply voltage. For the highest performance, the DCD correction term applied to the PWM ramp generator may be measured continuously. Additional sensors may also be provided to recalibrate the DCD sensor 1758. Such sensor may include temperature sensors, voltage supply sensors as well as timers.

Figure 18:
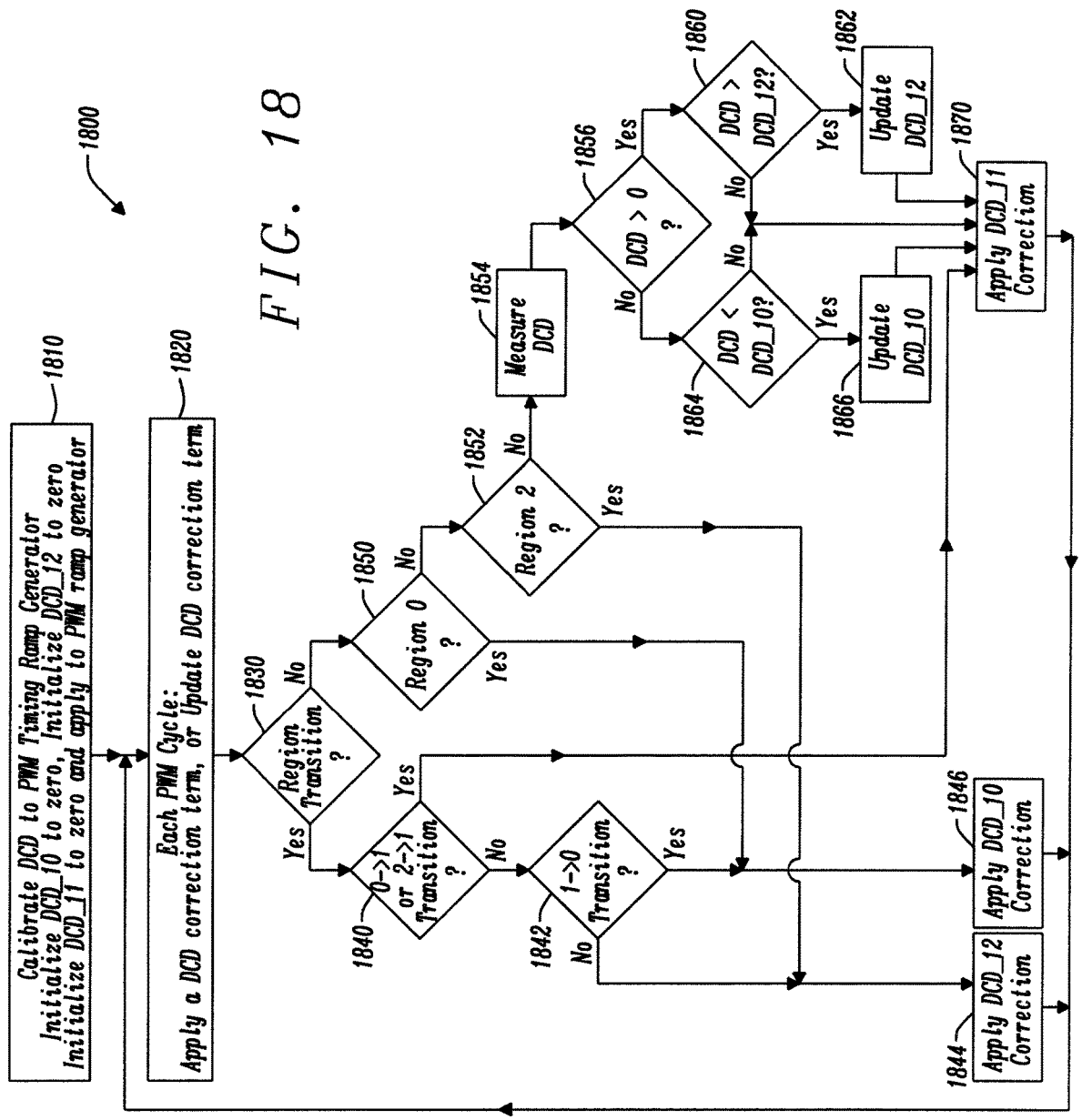
FIG. 18 is a flow diagram of a method for adjusting a ramp signal using a duty-cycle distortion correction term.

FIG. 18 illustrates a flow diagram 1800, of a method for applying a DCD correction term to a ramp signal. In this method, three correction terms are being used, referred to as DCD_11, DCD_10 and DCD_12. The DCD_11 term corresponds to a so-called zero offset correction and is applied in region<1>. The DCD_10 term corresponds to a crossing from operating region<1> to operating region<0> and is applied while the modulator operates in region<0>. The DCD_12 term corresponds to a crossing from region<1> to region<2> and is applied while the modulator operates in region<2>.

At step 1810 a calibration is performed by aligning the gain of the DCD sensor 1758 to the slope of the ramp signal generated by the ramp generator 1352. The correction terms DCD_10, DCD_12 and DCD_11 are initialized to zero and the DCD_11 correction term is applied to the ramp shift generator 1354.

At step 1820, for each PWM cycle, a DCD correction term is applied. A DCD value of the correction term may be updated on some PWM cycles. The DCD correction term may be measured and applied to the ramp generator in a continuous manner. The ramp shift generator 1354 receives the signal region <2:0>, and selects a correction term stored in the DCD sensor 1758 depending on whether the modulator operates in region <0>, region<1>, or region <2>. The selection occurs at the point where the input signal transits between regions.

At step 1830 a transition region may be identified. Further, when a transition is identified at step 1840 from region <0> to region <1> or from region <2> to region <1>, then the DCD_11 correction factor is applied to the PWM ramp at step 1870. When a transition is identified at step 1842 from region <1> to region <0>, then the DCD_10 correction factor is applied to the PWM ramp at step 1846. The remaining condition of a transition from region <1> to region <2> results in the application of the DCD_12 correction factor at step 1844.

However, if no transition is identified at step 1830, then a different correction factor is applied depending on the region of operation. If the system is in region<0> at step 1850, then the DCD_10 correction factor is applied at step 1846. If the system is in region<2> at step 1852, then the DCD_12 correction factor is applied at step 1844. If the system is in region <1>, then the DCD of the power stage is measured at step 1854. When the DCD is positive at step 1856, it is then compared with DCD_12 (step 1860) to either update DCD_12 (step 1862) or apply DCD_11 (1870). When the DCD is not positive, it is then compared with DCD_10 (step 1864) to either update DCD_10 (step 1866) or apply DCD_11 (1870).

The output stage DCD is measured over time, and the correction terms adjusted adaptively over multiple PWM cycles to be positioned as close as possible to the points at which output clamping occurs. The correction terms DCD_10 and DCD_12 may be obtained by measuring the DCD at output clamping, using a fast attack and a slow decay peak detection filter. In an alternative method, the DCD correction terms DCD_10 and DCD_12 may be estimated using an a priori knowledge of the time, within the PWM cycle, at which output clamping occurs.

Figure 19:
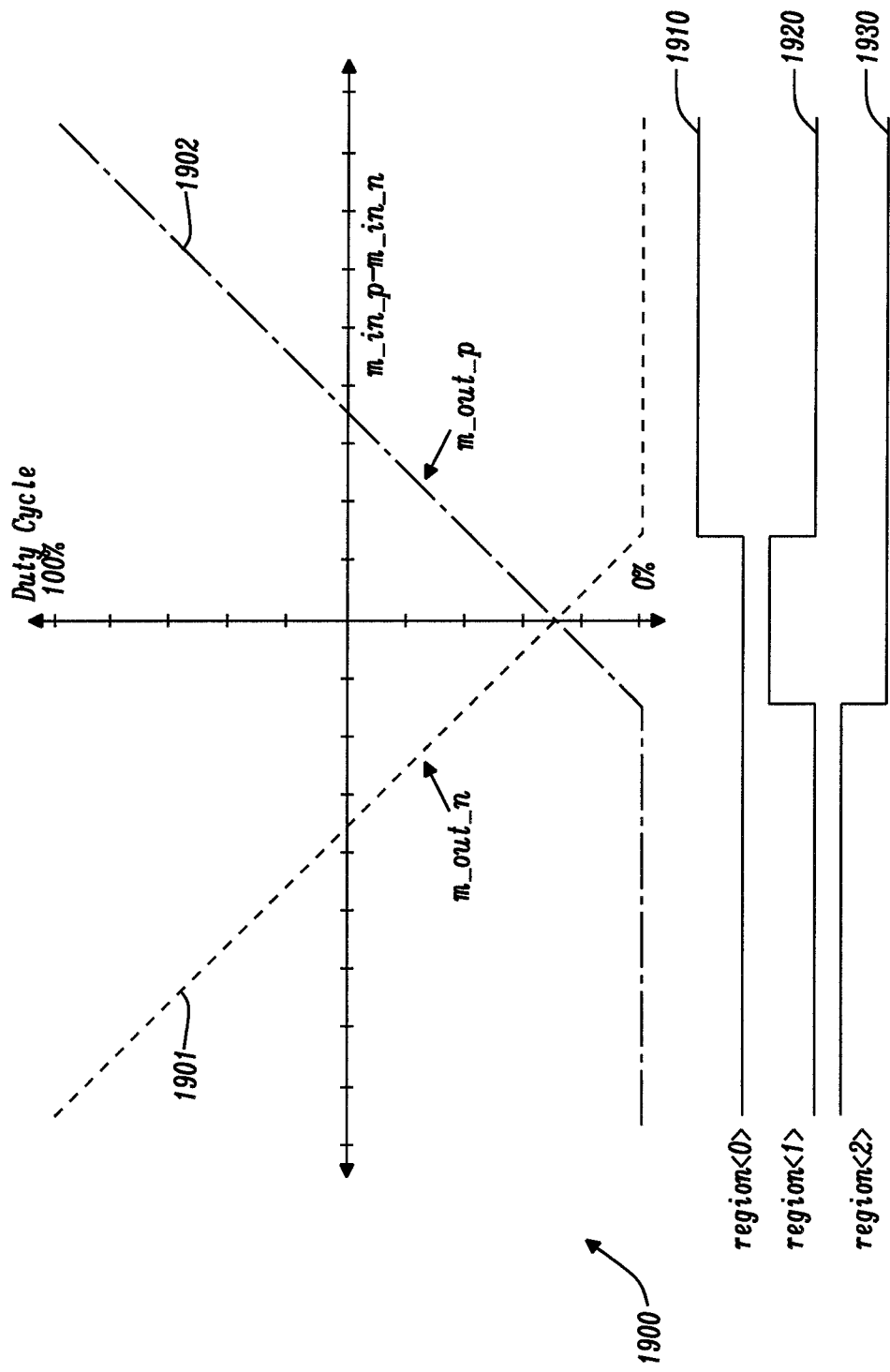
FIG. 19 is a chart illustrating the variations of the PWM outputs of the modulator of FIG. 5.

FIG. 19 illustrates the variations of the PWM outputs m_out_n 1901 and m_out_p 1902 of the modulator described in FIG. 5. FIG. 19 shows the relationship between the input signals (m_in_p and m_in_n), and three different operating regions: region<0> 1910, region<1> 1920 and region<2> 1930.

A skilled person will appreciate that variations of the disclosed arrangements are possible without departing from the disclosure. Although the modulator has been described in the context of an audio amplifier, it will be appreciated that such a modulator may be used in other applications. For instance, the modulator may be used in a signal amplifier for driving a haptic device or various actuators. Accordingly, the above description of the specific embodiment is made by way of example only and not for the purposes of limitation. It will be clear to the skilled person that minor modifications may be made without significant changes to the operation described.

What is claimed is:

1. A signal modulator for modulating at least one input signal; the modulator comprising
   an input stage adapted to receive the at least one input signal and a reference signal; and
   an adaptive ramp generator adapted to receive a clock signal having a clock cycle, to provide a ramp signal having a ramp signal profile starting from a minimum level in each clock cycle and to adjust the minimum level in each clock cycle; wherein the adaptive ramp generator is adapted to identify the signal having the highest amplitude among the at least one input signal and the reference signal, and to adjust the minimum level such that a peak value of the ramp signal is maintained substantially equal to the signal having the highest amplitude.

2. The signal modulator as claimed in claim 1, wherein the at least one input signal varies within an input signal amplitude range, and wherein the adaptive ramp generator is adapted to adjust the minimum level such that a peak value of the ramp signal is maintained substantially equal to the input signal in more than one region within the input signal amplitude range.

3. The signal modulator as claimed in claim 1, wherein the said at least one input signal comprises a first input signal and a second input signal; wherein the adaptive ramp generator is adapted to identify the signal having a highest amplitude among the first input signal, the second input signal and the reference signal.

4. The signal modulator as claimed in claim 1, wherein the reference signal has a reference level defining a minimum duty cycle.

5. The signal modulator as claimed in claim 3, wherein the ramp signal profile is a periodic profile that varies linearly between the minimum level and a maximum level in each clock cycle; the ramp signal profile being characterised by a maximum absolute amplitude.

6. The signal modulator as claimed in claim 5, wherein upon identifying that one of the first and second input signals is greater than the reference level the minimum level is set equal to an amplitude of the input signal having the highest amplitude minus the maximum absolute amplitude of the ramp signal profile, and upon identifying that the first and second input signals are both lower than the reference level, the minimum level is set to the reference level.

7. The signal modulator as claimed in claim 1, wherein the adaptive ramp generator comprises a ramp generation circuit coupled to a ramp shift generator, the ramp shift generator being adapted to calculate an offset value to adjust the minimum level.

8. The signal modulator as claimed in claim 7, wherein the adaptive ramp generator comprises a duty-cycle distortion sensor coupled to the ramp shift generator; the duty-cycle distortion sensor being adapted to sense a power stage duty-cycle distortion and to provide a duty-cycle distortion correction coefficient; wherein the ramp shift generator generates the offset value based on the duty-cycle distortion correction coefficient.

9. The signal modulator as claimed in claim 8, comprising a region identifier coupled to the adaptive ramp generator; the region identifier being adapted to identify a region of operation of the modulator; wherein the duty-cycle distortion sensor is adapted to provide the duty-cycle distortion correction coefficient based on the region of operation.

10. The signal modulator as claimed in claim 9, wherein the power stage duty-cycle distortion is sensed at a transition point between different regions of operation.

11. The signal modulator as claimed in claim 3, wherein the input stage is adapted to generate a first mask signal when a magnitude of the first input signal is above a threshold value, and a second mask signal when a magnitude of the second input signal is above the threshold value.

12. The signal modulator as claimed in claim 11, comprising a comparator stage adapted to compare the first input signal with the ramp signal to provide a first modulated output and to compare the second input signal with the ramp signal to provide a second modulated output; the comparator stage being adapted to receive the first and second mask signals and to block the first modulated output when the first mask signal is asserted; and to block the second modulated output when the second mask signal is asserted.

13. The signal modulator as claimed in claim 12, wherein each one of the first and second modulated output signals comprises a pulse and wherein the adaptive ramp generator is adapted to block the first modulated output or the second modulated output when its pulse has a pulse-width that falls below a minimum threshold.

14. A signal amplifier comprising
a power stage comprising a first half-bridge and a second half-bridge; and
a modulator adapted to provide a first modulated output for driving the first half-bridge; and a second modulated output for driving the second half-bridge,
wherein the modulator comprises an input stage adapted to receive at least one input signal and a reference signal; and an adaptive ramp generator adapted to receive a clock signal having a clock cycle, to provide a ramp signal having a ramp signal profile starting from a minimum level in each clock cycle and to adjust the minimum level in each clock cycle; wherein the adaptive ramp generator is adapted to identify the signal having the highest amplitude among the at least one input signal and the reference signal, and to adjust the minimum level such that a peak value of the ramp signal is maintained substantially equal to the signal having the highest amplitude.

15. A method of modulating at least one input signal, the method comprising
receiving the at least one input signal,
receiving a clock signal having a clock cycle,
receiving a reference signal,
providing a ramp signal having a profile that starts from a minimum level in each clock cycle,
identifying the signal having the highest amplitude among the at least one input signal and the reference signal, and
adjusting the minimum level in each cycle such that a peak value of the ramp signal is maintained substantially equal to the signal having the highest amplitude.

16. The method as claimed in claim 15, wherein the reference signal has a reference level defining a minimum duty cycle.

17. The method as claimed in claim 15, wherein the ramp signal profile is a periodic profile that varies linearly between the minimum level and a maximum level in each clock cycle; the ramp signal profile being characterized by a maximum absolute amplitude.

18. The method as claimed in claim 17, wherein the said at least one input signal comprises a first input signal and a second input signal; wherein upon identifying that one of the first and second input signals is greater than the reference level, the minimum level is set equal to an amplitude of the input signal having the highest amplitude minus the maximum absolute amplitude of the ramp signal profile; and upon identifying that the first and second input signals are both lower than the reference level, the minimum level is set to the reference level.

19. The method as claimed in claim 15, wherein providing the ramp signal comprises modifying an existing ramp signal.

* * * * *